(12) United States Patent
Czinger et al.

(10) Patent No.: US 11,786,971 B2
(45) Date of Patent: Oct. 17, 2023

(54) STRUCTURES AND METHODS FOR HIGH VOLUME PRODUCTION OF COMPLEX STRUCTURES USING INTERFACE NODES

(71) Applicant: Divergent Technologies, Inc., Los Angeles, CA (US)

(72) Inventors: Kevin Robert Czinger, Santa Monica, CA (US); Broc William TenHouten, Rancho Palos Verdes, CA (US); Antonio Bernerd Martinez, El Segundo, CA (US); Steven Blair Massey, Jr., Torrance, CA (US); Narender Shankar Lakshman, Torrance, CA (US); William David Kreig, Huntington Beach, CA (US); Jon Paul Gunner, Palos Verdes Estates, CA (US); David Brian TenHouten, El Segundo, CA (US); Eahab Nagi El Naga, Topanga, CA (US); Muhammad Faizan Zafar, Long Beach, CA (US)

(73) Assignee: DIVERGENT TECHNOLOGIES, INC., Los Angeles, CA (US)

( * ) Notice: Subject to any disclaimer, the term of this patent is extended or adjusted under 35 U.S.C. 154(b) by 1632 days.

(21) Appl. No.: 15/809,913

(22) Filed: Nov. 10, 2017

(65) Prior Publication Data
US 2019/0146456 A1 May 16, 2019

(51) Int. Cl.
*B22F 3/105* (2006.01)
*B22F 7/08* (2006.01)
(Continued)

(52) U.S. Cl.
CPC ............. *B22F 7/08* (2013.01); *B22F 3/105* (2013.01); *B22F 10/25* (2021.01); *B22F 10/28* (2021.01);
(Continued)

(58) Field of Classification Search
CPC ...... B33Y 80/00; B33Y 10/00; B62D 23/005; B62D 27/023; B62D 29/005;
(Continued)

(56) References Cited

U.S. PATENT DOCUMENTS

| 5,203,226 A | 4/1993 | Hongou et al. |
| 5,742,385 A | 4/1998 | Champa |

(Continued)

FOREIGN PATENT DOCUMENTS

| CN | 103717378 A | 4/2014 |
| CN | 204356896 U | 5/2015 |

(Continued)

OTHER PUBLICATIONS

US 9,202,136 B2, 12/2015, Schmidt et al. (withdrawn)
(Continued)

*Primary Examiner* — Daniel J Wiley
(74) *Attorney, Agent, or Firm* — ARENTFOX SCHIFF LLP

(57) ABSTRACT

A high precision Interface Node is disclosed. The Interface Node includes an integrated structure including one or more complex or sophisticated features and functions. The Interface Node may connect with another component or a Linking Node. The Interface Node is manufactured to achieve high precision functionality while enabling volume production. Current additive manufacturing technologies allow for the printing of high precision features to be manufactured, but generally this is performed at a slower rate. Consequently, in one aspect, the size of the Interface Nodes is
(Continued)

reduced in order to overcome at least part of the slower production volume caused by creating the high precision Interface Nodes. The components and Linking Nodes to which the Interface Node is connected may only have basic features and functions. Accordingly, this latter category of components may use a high print rate and thus high production volume. In other embodiments, these low precision components may also be produced using a non-print manufacturing technology, such as casting, forging, etc., that may provide the requisite high throughput, or to high precision machined parts that lack the geometric flexibility of the Interface Node. In an embodiment, the Interface Nodes may be connected to other components via a Linking Node.

37 Claims, 21 Drawing Sheets

(51) Int. Cl.
| | |
|---|---|
| *G05B 19/4099* | (2006.01) |
| *B28B 1/00* | (2006.01) |
| *B33Y 80/00* | (2015.01) |
| *G06F 30/13* | (2020.01) |
| *B22F 10/25* | (2021.01) |
| *B22F 10/28* | (2021.01) |
| *B22D 23/06* | (2006.01) |
| *B33Y 10/00* | (2015.01) |
| *B33Y 50/02* | (2015.01) |
| *B22F 10/30* | (2021.01) |
| *B22F 10/66* | (2021.01) |

(52) U.S. Cl.
CPC .............. *B28B 1/001* (2013.01); *B33Y 80/00* (2014.12); *G05B 19/4099* (2013.01); *G06F 30/13* (2020.01); *B22D 23/06* (2013.01); *B22F 10/30* (2021.01); *B22F 10/66* (2021.01); *B33Y 10/00* (2014.12); *B33Y 50/02* (2014.12)

(58) Field of Classification Search
CPC ..... B62D 29/046; B62D 29/048; B22F 3/105; G05B 19/4099
See application file for complete search history.

(56) References Cited

U.S. PATENT DOCUMENTS

| | | | |
|---|---|---|---|
| 5,990,444 A | 11/1999 | Costin | |
| 6,010,155 A | 1/2000 | Rinehart | |
| 6,096,249 A | 8/2000 | Yamaguchi | |
| 6,140,602 A | 10/2000 | Costin | |
| 6,250,533 B1 | 6/2001 | Otterbein et al. | |
| 6,252,196 B1 | 6/2001 | Costin et al. | |
| 6,318,642 B1 | 11/2001 | Goenka et al. | |
| 6,365,057 B1 | 4/2002 | Whitehurst et al. | |
| 6,391,251 B1 | 5/2002 | Keicher et al. | |
| 6,409,930 B1 | 6/2002 | Whitehurst et al. | |
| 6,468,439 B1 | 10/2002 | Whitehurst et al. | |
| 6,554,345 B2 | 4/2003 | Jonsson | |
| 6,585,151 B1 | 7/2003 | Ghosh | |
| 6,644,721 B1 | 11/2003 | Miskech et al. | |
| 6,811,744 B2 | 11/2004 | Keicher et al. | |
| 6,866,497 B2 | 3/2005 | Saiki | |
| 6,919,035 B1 | 7/2005 | Clough | |
| 6,926,970 B2 | 8/2005 | James et al. | |
| 7,152,292 B2 | 12/2006 | Hohmann et al. | |
| 7,344,186 B1 | 3/2008 | Hausler et al. | |
| 7,500,373 B2 | 3/2009 | Quell | |
| 7,586,062 B2 | 9/2009 | Heberer | |
| 7,637,134 B2 | 12/2009 | Burzlaff et al. | |
| 7,710,347 B2 | 5/2010 | Gentilman et al. | |
| 7,716,802 B2 | 5/2010 | Stern et al. | |
| 7,745,293 B2 | 6/2010 | Yamazaki et al. | |
| 7,766,123 B2 | 8/2010 | Sakurai et al. | |
| 7,852,388 B2 | 12/2010 | Shimizu et al. | |
| 7,908,922 B2 | 3/2011 | Zarabadi et al. | |
| 7,951,324 B2 | 5/2011 | Naruse et al. | |
| 8,094,036 B2 | 1/2012 | Heberer | |
| 8,163,077 B2 | 4/2012 | Eron et al. | |
| 8,286,236 B2 | 10/2012 | Jung et al. | |
| 8,289,352 B2 | 10/2012 | Vartanian et al. | |
| 8,297,096 B2 | 10/2012 | Mizumura et al. | |
| 8,354,170 B1 | 1/2013 | Henry et al. | |
| 8,383,028 B2 * | 2/2013 | Lyons .................... | B33Y 80/00 264/274 |
| 8,408,036 B2 | 4/2013 | Reith et al. | |
| 8,414,002 B2 * | 4/2013 | Yu .......................... | B60G 7/001 280/124.134 |
| 8,429,754 B2 | 4/2013 | Jung et al. | |
| 8,437,513 B1 | 5/2013 | Derakhshani et al. | |
| 8,444,903 B2 | 5/2013 | Lyons et al. | |
| 8,452,073 B2 | 5/2013 | Taminger et al. | |
| 8,599,301 B2 | 12/2013 | Dowski, Jr. et al. | |
| 8,606,540 B2 | 12/2013 | Haisty et al. | |
| 8,610,761 B2 | 12/2013 | Haisty et al. | |
| 8,631,996 B2 | 1/2014 | Quell et al. | |
| 8,675,925 B2 | 3/2014 | Derakhshani et al. | |
| 8,678,060 B2 | 3/2014 | Dietz et al. | |
| 8,686,314 B2 | 4/2014 | Schneegans et al. | |
| 8,686,997 B2 | 4/2014 | Radet et al. | |
| 8,694,284 B2 | 4/2014 | Berard | |
| 8,720,876 B2 | 5/2014 | Reith et al. | |
| 8,752,166 B2 | 6/2014 | Jung et al. | |
| 8,755,923 B2 | 6/2014 | Farahani et al. | |
| 8,787,628 B1 | 7/2014 | Derakhshani et al. | |
| 8,818,771 B2 | 8/2014 | Gielis et al. | |
| 8,873,238 B2 | 10/2014 | Wilkins | |
| 8,978,535 B2 | 3/2015 | Ortiz et al. | |
| 9,006,605 B2 | 4/2015 | Schneegans et al. | |
| 9,071,436 B2 | 6/2015 | Jung et al. | |
| 9,101,979 B2 | 8/2015 | Hofmann et al. | |
| 9,104,921 B2 | 8/2015 | Derakhshani et al. | |
| 9,126,365 B1 | 9/2015 | Mark et al. | |
| 9,128,476 B2 | 9/2015 | Jung et al. | |
| 9,138,924 B2 | 9/2015 | Yen | |
| 9,149,988 B2 | 10/2015 | Mark et al. | |
| 9,156,205 B2 | 10/2015 | Mark et al. | |
| 9,186,848 B2 | 11/2015 | Mark et al. | |
| 9,244,986 B2 | 1/2016 | Karmarkar | |
| 9,248,611 B2 | 2/2016 | Divine et al. | |
| 9,254,535 B2 | 2/2016 | Buller et al. | |
| 9,266,566 B2 | 2/2016 | Kim | |
| 9,269,022 B2 | 2/2016 | Rhoads et al. | |
| 9,327,452 B2 | 5/2016 | Mark et al. | |
| 9,329,020 B1 | 5/2016 | Napoletano | |
| 9,332,251 B2 | 5/2016 | Haisty et al. | |
| 9,346,127 B2 | 5/2016 | Buller et al. | |
| 9,389,315 B2 | 7/2016 | Bruder et al. | |
| 9,399,256 B2 | 7/2016 | Buller et al. | |
| 9,403,235 B2 | 8/2016 | Buller et al. | |
| 9,418,193 B2 | 8/2016 | Dowski, Jr. et al. | |
| 9,457,514 B2 | 10/2016 | Schwärzler | |
| 9,469,057 B2 | 10/2016 | Johnson et al. | |
| 9,478,063 B2 | 10/2016 | Rhoads et al. | |
| 9,481,402 B1 | 11/2016 | Muto et al. | |
| 9,486,878 B2 | 11/2016 | Buller et al. | |
| 9,486,960 B2 | 11/2016 | Paschkewitz et al. | |
| 9,502,993 B2 | 11/2016 | Deng | |
| 9,525,262 B2 | 12/2016 | Stuart et al. | |
| 9,533,526 B1 | 1/2017 | Nevins | |
| 9,555,315 B2 | 1/2017 | Aders | |
| 9,555,580 B1 | 1/2017 | Dykstra et al. | |
| 9,557,856 B2 | 1/2017 | Send et al. | |
| 9,566,742 B2 | 2/2017 | Keating et al. | |
| 9,566,758 B2 | 2/2017 | Cheung et al. | |
| 9,573,193 B2 | 2/2017 | Buller et al. | |
| 9,573,225 B2 | 2/2017 | Buller et al. | |
| 9,586,290 B2 | 3/2017 | Buller et al. | |
| 9,595,795 B2 | 3/2017 | Lane et al. | |
| 9,597,843 B2 | 3/2017 | Stauffer et al. | |
| 9,600,929 B1 | 3/2017 | Young et al. | |

(56) References Cited

U.S. PATENT DOCUMENTS

| | | |
|---|---|---|
| 9,609,755 B2 | 3/2017 | Coull et al. |
| 9,610,737 B2 | 4/2017 | Johnson et al. |
| 9,611,667 B2 | 4/2017 | GangaRao et al. |
| 9,616,623 B2 | 4/2017 | Johnson et al. |
| 9,626,487 B2 | 4/2017 | Jung et al. |
| 9,626,489 B2 | 4/2017 | Nilsson |
| 9,643,361 B2 | 5/2017 | Liu |
| 9,662,840 B1 | 5/2017 | Buller et al. |
| 9,665,182 B2 | 5/2017 | Send et al. |
| 9,672,389 B1 | 6/2017 | Mosterman et al. |
| 9,672,550 B2 | 6/2017 | Apsley et al. |
| 9,676,145 B2 | 6/2017 | Buller et al. |
| 9,684,919 B2 | 6/2017 | Apsley et al. |
| 9,688,032 B2 | 6/2017 | Kia et al. |
| 9,690,286 B2 | 6/2017 | Hovsepian et al. |
| 9,700,966 B2 | 7/2017 | Kraft et al. |
| 9,703,896 B2 | 7/2017 | Zhang et al. |
| 9,713,903 B2 | 7/2017 | Paschkewitz et al. |
| 9,718,302 B2 | 8/2017 | Young et al. |
| 9,718,434 B2 | 8/2017 | Hector, Jr. et al. |
| 9,724,877 B2 | 8/2017 | Flitsch et al. |
| 9,724,881 B2 | 8/2017 | Johnson et al. |
| 9,725,178 B2 | 8/2017 | Wang |
| 9,731,730 B2 | 8/2017 | Stiles |
| 9,731,773 B2 | 8/2017 | Gami et al. |
| 9,741,954 B2 | 8/2017 | Bruder et al. |
| 9,747,352 B2 | 8/2017 | Karmarkar |
| 9,764,415 B2 | 9/2017 | Seufzer et al. |
| 9,764,520 B2 | 9/2017 | Johnson et al. |
| 9,765,226 B2 | 9/2017 | Dain |
| 9,770,760 B2 | 9/2017 | Liu |
| 9,773,393 B2 | 9/2017 | Velez |
| 9,776,234 B2 | 10/2017 | Schaafhausen et al. |
| 9,782,936 B2 | 10/2017 | Glunz et al. |
| 9,783,324 B2 | 10/2017 | Embler et al. |
| 9,783,977 B2 | 10/2017 | Alqasimi et al. |
| 9,789,548 B2 | 10/2017 | Golshany et al. |
| 9,789,922 B2 | 10/2017 | Dosenbach et al. |
| 9,796,137 B2 | 10/2017 | Zhang et al. |
| 9,802,108 B2 | 10/2017 | Aders |
| 9,809,977 B2 | 11/2017 | Carney et al. |
| 9,817,922 B2 | 11/2017 | Glunz et al. |
| 9,818,071 B2 | 11/2017 | Jung et al. |
| 9,821,339 B2 | 11/2017 | Paschkewitz et al. |
| 9,821,411 B2 | 11/2017 | Buller et al. |
| 9,823,143 B2 | 11/2017 | Twelves, Jr. et al. |
| 9,829,564 B2 | 11/2017 | Bruder et al. |
| 9,846,933 B2 | 12/2017 | Yuksel |
| 9,854,828 B2 | 1/2018 | Langeland |
| 9,858,604 B2 | 1/2018 | Apsley et al. |
| 9,862,833 B2 | 1/2018 | Hasegawa et al. |
| 9,862,834 B2 | 1/2018 | Hasegawa et al. |
| 9,863,885 B2 | 1/2018 | Zaretski et al. |
| 9,870,629 B2 | 1/2018 | Cardno et al. |
| 9,879,981 B1 | 1/2018 | Dehghan Niri et al. |
| 9,884,663 B2 | 2/2018 | Czinger et al. |
| 9,898,776 B2 | 2/2018 | Apsley et al. |
| 9,914,150 B2 | 3/2018 | Pettersson et al. |
| 9,919,360 B2 | 3/2018 | Buller et al. |
| 9,931,697 B2 | 4/2018 | Levin et al. |
| 9,933,031 B2 | 4/2018 | Bracamonte et al. |
| 9,933,092 B2 | 4/2018 | Sindelar |
| 9,957,031 B2 | 5/2018 | Golshany et al. |
| 9,958,535 B2 | 5/2018 | Send et al. |
| 9,962,767 B2 | 5/2018 | Buller et al. |
| 9,963,978 B2 | 5/2018 | Johnson et al. |
| 9,971,920 B2 | 5/2018 | Derakhshani et al. |
| 9,976,063 B2 | 5/2018 | Childers et al. |
| 9,987,792 B2 | 6/2018 | Flitsch et al. |
| 9,988,136 B2 | 6/2018 | Tiryaki et al. |
| 9,989,623 B2 | 6/2018 | Send et al. |
| 9,990,565 B2 | 6/2018 | Rhoads et al. |
| 9,994,339 B2 | 6/2018 | Colson et al. |
| 9,996,890 B1 | 6/2018 | Cinnamon et al. |
| 9,996,945 B1 | 6/2018 | Holzer et al. |
| 10,002,215 B2 | 6/2018 | Dowski et al. |
| 10,006,156 B2 | 6/2018 | Kirkpatrick |
| 10,011,089 B2 | 7/2018 | Lyons et al. |
| 10,011,685 B2 | 7/2018 | Childers et al. |
| 10,012,532 B2 | 7/2018 | Send et al. |
| 10,013,777 B2 | 7/2018 | Mariampillai et al. |
| 10,015,908 B2 | 7/2018 | Williams et al. |
| 10,016,852 B2 | 7/2018 | Broda |
| 10,016,942 B2 | 7/2018 | Mark et al. |
| 10,017,384 B1 | 7/2018 | Greer et al. |
| 10,018,576 B2 | 7/2018 | Herbsommer et al. |
| 10,022,792 B2 | 7/2018 | Srivas et al. |
| 10,022,912 B2 | 7/2018 | Kia et al. |
| 10,027,376 B2 | 7/2018 | Sankaran et al. |
| 10,029,415 B2 | 7/2018 | Swanson et al. |
| 10,040,239 B2 | 8/2018 | Brown, Jr. |
| 10,046,412 B2 | 8/2018 | Blackmore |
| 10,048,769 B2 | 8/2018 | Selker et al. |
| 10,052,712 B2 | 8/2018 | Blackmore |
| 10,052,820 B2 | 8/2018 | Kemmer et al. |
| 10,055,536 B2 | 8/2018 | Maes et al. |
| 10,058,764 B2 | 8/2018 | Aders |
| 10,058,920 B2 | 8/2018 | Buller et al. |
| 10,061,906 B2 | 8/2018 | Nilsson |
| 10,065,270 B2 | 9/2018 | Buller et al. |
| 10,065,361 B2 | 9/2018 | Susnjara et al. |
| 10,065,367 B2 | 9/2018 | Brown, Jr. |
| 10,068,316 B1 | 9/2018 | Holzer et al. |
| 10,071,422 B2 | 9/2018 | Buller et al. |
| 10,071,525 B2 | 9/2018 | Susnjara et al. |
| 10,072,179 B2 | 9/2018 | Drijfhout |
| 10,074,128 B2 | 9/2018 | Colson et al. |
| 10,076,875 B2 | 9/2018 | Mark et al. |
| 10,076,876 B2 | 9/2018 | Mark et al. |
| 10,081,140 B2 | 9/2018 | Paesano et al. |
| 10,081,431 B2 | 9/2018 | Seack et al. |
| 10,086,568 B2 | 10/2018 | Snyder et al. |
| 10,087,320 B2 | 10/2018 | Simmons et al. |
| 10,087,556 B2 | 10/2018 | Gallucci et al. |
| 10,099,427 B2 | 10/2018 | Mark et al. |
| 10,100,542 B2 | 10/2018 | GangaRao et al. |
| 10,100,890 B2 | 10/2018 | Bracamonte et al. |
| 10,107,344 B2 | 10/2018 | Bracamonte et al. |
| 10,108,766 B2 | 10/2018 | Druckman et al. |
| 10,113,600 B2 | 10/2018 | Bracamonte et al. |
| 10,118,347 B2 | 11/2018 | Stauffer et al. |
| 10,118,579 B2 | 11/2018 | Lakic |
| 10,120,078 B2 | 11/2018 | Bruder et al. |
| 10,124,546 B2 | 11/2018 | Johnson et al. |
| 10,124,570 B2 | 11/2018 | Evans et al. |
| 10,137,500 B2 | 11/2018 | Blackmore |
| 10,138,354 B2 | 11/2018 | Groos et al. |
| 10,144,126 B2 | 12/2018 | Krohne et al. |
| 10,145,110 B2 | 12/2018 | Carney et al. |
| 10,151,363 B2 | 12/2018 | Bracamonte et al. |
| 10,152,661 B2 | 12/2018 | Kieser |
| 10,160,278 B2 | 12/2018 | Coombs et al. |
| 10,161,021 B2 | 12/2018 | Lin et al. |
| 10,166,752 B2 | 1/2019 | Evans et al. |
| 10,166,753 B2 | 1/2019 | Evans et al. |
| 10,171,578 B1 | 1/2019 | Cook et al. |
| 10,173,255 B2 * | 1/2019 | TenHouten ............ B62D 25/04 |
| 10,173,327 B2 | 1/2019 | Kraft et al. |
| 10,178,800 B2 | 1/2019 | Mahalingam et al. |
| 10,179,640 B2 | 1/2019 | Wilkerson |
| 10,183,330 B2 | 1/2019 | Buller et al. |
| 10,183,478 B2 | 1/2019 | Evans et al. |
| 10,189,187 B2 | 1/2019 | Keating et al. |
| 10,189,240 B2 | 1/2019 | Evans et al. |
| 10,189,241 B2 | 1/2019 | Evans et al. |
| 10,189,242 B2 | 1/2019 | Evans et al. |
| 10,190,424 B2 | 1/2019 | Johnson et al. |
| 10,195,693 B2 | 2/2019 | Buller et al. |
| 10,196,539 B2 | 2/2019 | Boonen et al. |
| 10,197,338 B2 | 2/2019 | Melsheimer |
| 10,200,677 B2 | 2/2019 | Trevor et al. |
| 10,201,932 B2 | 2/2019 | Flitsch et al. |
| 10,201,941 B2 | 2/2019 | Evans et al. |
| 10,202,673 B2 | 2/2019 | Lin et al. |

(56) References Cited

U.S. PATENT DOCUMENTS

| | | |
|---|---|---|
| 10,204,216 B2 | 2/2019 | Nejati et al. |
| 10,207,454 B2 | 2/2019 | Buller et al. |
| 10,209,065 B2 | 2/2019 | Estevo, Jr. et al. |
| 10,210,662 B2 | 2/2019 | Holzer et al. |
| 10,213,837 B2 | 2/2019 | Kondoh |
| 10,214,248 B2 | 2/2019 | Hall et al. |
| 10,214,252 B2 | 2/2019 | Schellekens et al. |
| 10,214,275 B2 | 2/2019 | Goehlich |
| 10,220,575 B2 | 3/2019 | Reznar |
| 10,220,881 B2 | 3/2019 | Tyan et al. |
| 10,221,530 B2 | 3/2019 | Driskell et al. |
| 10,226,900 B1 | 3/2019 | Nevins |
| 10,232,550 B2 | 3/2019 | Evans et al. |
| 10,234,342 B2 | 3/2019 | Moorlag et al. |
| 10,237,477 B2 | 3/2019 | Trevor et al. |
| 10,252,335 B2 | 4/2019 | Buller et al. |
| 10,252,336 B2 | 4/2019 | Buller et al. |
| 10,254,499 B1 | 4/2019 | Cohen et al. |
| 10,257,499 B2 | 4/2019 | Hintz et al. |
| 10,259,044 B2 | 4/2019 | Buller et al. |
| 10,268,181 B1 | 4/2019 | Nevins |
| 10,269,225 B2 | 4/2019 | Velez |
| 10,272,860 B2 | 4/2019 | Mohapatra et al. |
| 10,272,862 B2 | 4/2019 | Whitehead |
| 10,275,564 B2 | 4/2019 | Ridgeway et al. |
| 10,279,580 B2 | 5/2019 | Evans et al. |
| 10,285,219 B2 | 5/2019 | Fetfatsidis et al. |
| 10,286,452 B2 | 5/2019 | Buller et al. |
| 10,286,603 B2 | 5/2019 | Buller et al. |
| 10,286,961 B2 | 5/2019 | Hillebrecht et al. |
| 10,289,263 B2 | 5/2019 | Troy et al. |
| 10,289,875 B2 | 5/2019 | Singh et al. |
| 10,291,193 B2 | 5/2019 | Dandu et al. |
| 10,294,552 B2 | 5/2019 | Liu et al. |
| 10,294,982 B2 | 5/2019 | Gabrys et al. |
| 10,295,989 B1 | 5/2019 | Nevins |
| 10,303,159 B2 | 5/2019 | Czinger et al. |
| 10,307,824 B2 | 6/2019 | Kondoh |
| 10,310,197 B1 | 6/2019 | Droz et al. |
| 10,313,651 B2 | 6/2019 | Trevor et al. |
| 10,315,252 B2 | 6/2019 | Mendelsberg et al. |
| 10,336,050 B2 | 7/2019 | Susnjara |
| 10,337,542 B2 | 7/2019 | Hesslewood et al. |
| 10,337,952 B2 | 7/2019 | Bosetti et al. |
| 10,339,266 B2 | 7/2019 | Urick et al. |
| 10,343,330 B2 | 7/2019 | Evans et al. |
| 10,343,331 B2 | 7/2019 | McCall et al. |
| 10,343,355 B2 | 7/2019 | Evans et al. |
| 10,343,724 B2 | 7/2019 | Polewarczyk et al. |
| 10,343,725 B2 | 7/2019 | Martin et al. |
| 10,350,823 B2 | 7/2019 | Rolland et al. |
| 10,356,341 B2 | 7/2019 | Holzer et al. |
| 10,356,395 B2 | 7/2019 | Holzer et al. |
| 10,357,829 B2 | 7/2019 | Spink et al. |
| 10,357,957 B2 | 7/2019 | Buller et al. |
| 10,359,756 B2 | 7/2019 | Newell et al. |
| 10,369,629 B2 | 8/2019 | Mendelsberg et al. |
| 10,382,739 B1 | 8/2019 | Rusu et al. |
| 10,384,393 B2 | 8/2019 | Xu et al. |
| 10,384,416 B2 | 8/2019 | Cheung et al. |
| 10,389,410 B2 | 8/2019 | Brooks et al. |
| 10,391,710 B2 | 8/2019 | Mondesir |
| 10,392,097 B2 | 8/2019 | Pham et al. |
| 10,392,131 B2 | 8/2019 | Deck et al. |
| 10,393,315 B2 | 8/2019 | Tyan |
| 10,400,080 B2 | 9/2019 | Ramakrishnan et al. |
| 10,401,832 B2 | 9/2019 | Snyder et al. |
| 10,403,009 B2 | 9/2019 | Mariampillai et al. |
| 10,406,750 B2 | 9/2019 | Barton et al. |
| 10,412,283 B2 | 9/2019 | Send et al. |
| 10,416,095 B2 | 9/2019 | Herbsommer et al. |
| 10,421,496 B2 | 9/2019 | Swayne et al. |
| 10,421,863 B2 | 9/2019 | Hasegawa et al. |
| 10,422,478 B2 | 9/2019 | Leachman et al. |
| 10,425,793 B2 | 9/2019 | Sankaran et al. |
| 10,427,364 B2 | 10/2019 | Alves |
| 10,429,006 B2 | 10/2019 | Tyan et al. |
| 10,434,573 B2 | 10/2019 | Buller et al. |
| 10,435,185 B2 | 10/2019 | Divine et al. |
| 10,435,773 B2 | 10/2019 | Liu et al. |
| 10,436,038 B2 | 10/2019 | Buhler et al. |
| 10,438,407 B2 | 10/2019 | Pavanaskar et al. |
| 10,440,351 B2 | 10/2019 | Holzer et al. |
| 10,442,002 B2 | 10/2019 | Benthien et al. |
| 10,442,003 B2 | 10/2019 | Symeonidis et al. |
| 10,449,696 B2 | 10/2019 | Elgar et al. |
| 10,449,737 B2 | 10/2019 | Johnson et al. |
| 10,461,810 B2 | 10/2019 | Cook et al. |
| 2005/0183248 A1 | 8/2005 | Gallant et al. |
| 2006/0108783 A1 | 5/2006 | Ni et al. |
| 2008/0241765 A1 | 10/2008 | Wood |
| 2014/0242400 A1 | 8/2014 | Hoebel et al. |
| 2014/0277669 A1 | 9/2014 | Nardi et al. |
| 2015/0174821 A1 | 6/2015 | Levine et al. |
| 2015/0246391 A1 | 9/2015 | Andreussi et al. |
| 2016/0010469 A1 | 1/2016 | Guo |
| 2016/0016229 A1* | 1/2016 | Czinger ............... B62D 21/17 296/205 |
| 2016/0228991 A1 | 8/2016 | Ryan et al. |
| 2017/0050677 A1 | 2/2017 | Czinger et al. |
| 2017/0113344 A1 | 4/2017 | Schönberg |
| 2017/0341309 A1 | 11/2017 | Piepenbrock et al. |

FOREIGN PATENT DOCUMENTS

| | | |
|---|---|---|
| CN | 104763151 A | 7/2015 |
| CN | 104881513 A | 9/2015 |
| CN | 106794634 U | 5/2017 |
| CN | 209632123 U | 11/2019 |
| JP | 2015-120343 A | 7/2015 |
| JP | 2017-089710 A | 5/2017 |
| KR | 1020150073083 A | 6/2015 |
| WO | 1996036455 A1 | 11/1996 |
| WO | 1996036525 A1 | 11/1996 |
| WO | 1996038260 A1 | 12/1996 |
| WO | 2003024641 A1 | 3/2003 |
| WO | 2004108343 A1 | 12/2004 |
| WO | 2005093773 A1 | 10/2005 |
| WO | 2007003375 A1 | 1/2007 |
| WO | 2007110235 A1 | 10/2007 |
| WO | 2007110236 A1 | 10/2007 |
| WO | 2008019847 A1 | 2/2008 |
| WO | 2007128586 A3 | 6/2008 |
| WO | 2008068314 A2 | 6/2008 |
| WO | 2008086994 A1 | 7/2008 |
| WO | 2008087024 A1 | 7/2008 |
| WO | 2008107130 A1 | 9/2008 |
| WO | 2008138503 A1 | 11/2008 |
| WO | 2008145396 A1 | 12/2008 |
| WO | 2009083609 A2 | 7/2009 |
| WO | 2009098285 A1 | 8/2009 |
| WO | 2009112520 A1 | 9/2009 |
| WO | 2009135938 A1 | 11/2009 |
| WO | 2009140977 A1 | 11/2009 |
| WO | 2010125057 A2 | 11/2010 |
| WO | 2010125058 A1 | 11/2010 |
| WO | 2010142703 A2 | 12/2010 |
| WO | 2011032533 A1 | 3/2011 |
| WO | 2014016437 A1 | 1/2014 |
| WO | 2014187720 A1 | 11/2014 |
| WO | 2014195340 A1 | 12/2014 |
| WO | 2015175892 A1 | 11/2015 |
| WO | 2015193331 A1 | 12/2015 |
| WO | 2016116414 A1 | 7/2016 |
| WO | 2016/197047 A1 | 12/2016 |
| WO | 2017036461 A1 | 3/2017 |
| WO | 2019030248 A1 | 2/2019 |
| WO | 2019042504 A1 | 3/2019 |
| WO | 2019048010 A1 | 3/2019 |
| WO | 2019048498 A1 | 3/2019 |

(56) References Cited

FOREIGN PATENT DOCUMENTS

WO    2019048680 A1    3/2019
WO    2019048682 A1    3/2019

OTHER PUBLICATIONS

US 9,809,265 B2, 11/2017, Kinjo (withdrawn)
US 10,449,880 B2, 10/2019, Mizobata et al. (withdrawn)
International Search Report and Written Opinion dated Apr. 16, 2019 regarding PCT/US2018/057823.
The Extended European Search Report issued for corresponding application EP 18876496.3, dated Sep. 24, 2021, 8 pages.
Japanese version of the Notice of Reasons for Rejection issued in corresponding Japanese Patent Application 2020-520220, dated Apr. 19, 2022.
English language translation of the Notice of Reasons for Rejection issued in corresponding Japanese Patent Application 2020-520220, dated Apr. 19, 2022.
Chinese version of the Notification of the First Office Action issued in corresponding Chinese Application No. 201811330197.X, dated May 18, 2022.
English language translation of the Notification of the First Office Action issued in corresponding Chinese Application No. 201811330197.X, dated May 18, 2022.
First Office Action in KR1020207013383, dated Dec. 22, 2022, 7 pages.

* cited by examiner

STRUCTURES AND METHODS FOR HIGH VOLUME PRODUCTION OF COMPLEX STRUCTURES USING INTERFACE NODES

BACKGROUND

Field

The present disclosure relates generally to transport structures and other mechanical assemblies, and more specifically to Interface Nodes for connecting components in an integrated structure.

Background

Additive manufacturing (AM), also known as three-dimensional (3-D) printing, uses a computer-aided data model for depositing and manipulating layered materials on a substrate to produce a 3-D structure having features defined by the model. A significant advantage of current AM technologies is that they can yield components with multifaceted geometrical features and complex structures using materials with precisely-defined characteristics. For example, recent 3-D printers are capable of printing very small feature sizes and layer heights, and can therefore render components having very fine levels of detail. Further, lasers and electron-based energy sources in PBF-based, DED, and other AM technologies can print objects using a variety of ubiquitous metals and alloys. AM also allows for significant design flexibility as it is non-design specific. Because AM is non-design specific, it offers geometric and design flexibility that other manufacturing processes cannot. Unlike a mold which is typically used to produce a single shaped-part, AM can produce objects having innumerable shapes and sizes. Very large objects exceeding printer size specifications can also be segregated at the design phase, printed in parallel and combined. AM is, in short, fast becoming prevalent in industry sectors where the production of complex and diverse mechanical structures is a mainstay.

One tradeoff faced by designers in AM is that in general, the more sophisticated the features or functions designed for use in a component to be 3-D printed, the lower the expected production volume. The production volume also decreases with the increasing size of the 3-D printed component. These practical limitations are often inherent in certain AM processes, which may rely on slower printing speeds for accurate rendering of complex geometries and which must apply more overall layers to render large structures. Still other technology-dependent factors are relevant to determining the overall production value, including throughput, of a particular AM technology.

AM can be contrasted with conventional manufacturing techniques such as machining, milling, molding, forging, casting and the like. Casting, for one, can efficiently produce structures with a high throughput even where the structures are voluminous or heavy. However, casting and other conventional techniques are typically not economically suitable for high-throughput production of more complex structures. These include structures with sophisticated internal features, precise material properties, rigid tolerance requirements, and/or other complex internal architectural attributes. Using conventional manufacturing techniques to produce these types of precision components can be extremely expensive. For instance, machining techniques can produce very precise and complex geometrical structures having intricate features. However, machining is inherently not cost-effective, and more often than not, is prohibitively expensive for applications that rely on any kind of high-volume production of such complex structures. Furthermore, due to inherent physical limitations of the process, some structures cannot be manufactured using machining. An example includes lattice structures, which are utilized in some modern mechanized technologies due to their versatility and lightweight nature. Thus other alternatives must be considered.

Techniques are consequently needed for integrating the benefits of AM and its ability to create complex structures with sophisticated features on one hand, with the advantages of higher-throughput manufacturing techniques to effect decreased lead times and increased production capacities on the other hand, to thereby enable the manufacture of structures that enjoy the combined benefits of both.

SUMMARY

Several aspects of Interface Nodes and structures using Interface Nodes are herein disclosed.

In one aspect, an Interface Node (IN) additively manufactured (AM) at a reduced size using a print process to achieve high precision and a production volume per the AM technology in use includes at least one connection feature configured to connect to a lower precision component additively manufactured using a high speed production process.

In another aspect, an Interface Node (IN) additively manufactured (AM) at a reduced size using a print process to achieve high precision and a production volume per the AM technology in use includes at least one connection feature configured to connect to a cast component, and at least one high precision feature from a set including a geometrically complex feature, a thermally complex feature, a multi-material complex feature comprising different materials or compositions thereof, or a complex tolerance requirement.

In another aspect, an Interface Node (IN) additively manufactured (AM) at a reduced size using a print process to achieve high precision and a production volume per the AM technology in use includes at least one connection feature configured to connect to a cast component, and an adhesive inlet channel.

In another aspect, an Interface Node (IN) additively manufactured (AM) at a reduced size using a print speed to achieve a high precision as per the AM technology in use includes at least one connection feature configured to connect to a high precision, low feature machined component using a high speed production process with lower geometric flexibility than the AM technology in use, and at least one high precision feature from a set including a geometrically complex feature, a thermally complex feature, a multi-material complex feature comprising different materials or compositions thereof, or a complex tolerance requirement.

In another aspect, an Interface Node (IN) additively manufactured (AM) at a reduced size using a print speed to achieve a high precision as per the AM technology in use includes at least one connection feature configured to connect to a high precision, low feature machined component using a high speed production process with lower geometric flexibility than the AM technology in use, and an adhesive inlet channel.

In another aspect, a method of manufacturing parts includes designing an Interface Node (IN) with high precision features, determining a size of the IN to increase production volume, additively manufacturing (AM) the IN using a lower print rate per the AM technology in use to achieve the high precision, and connecting the IN to a component manufactured using a higher production rate.

It will be understood that other aspects of connecting Interface Nodes to high-throughput manufactured components will become readily apparent to those skilled in the art from the following detailed description, wherein it is shown and described only several embodiments by way of illustration. As will be realized by those skilled in the art, the aspects and embodiments and their several details disclosed herein are capable of modification in various other respects, all without departing from the invention. Accordingly, the drawings and detailed description are to be regarded as illustrative in nature and not as restrictive.

BRIEF DESCRIPTION OF THE DRAWINGS

Various aspects of structures and methods for high volume production of complex structures using Interface Nodes will now be presented in the detailed description by way of example, and not by way of limitation, in the accompanying drawings, wherein.

DETAILED DESCRIPTION

Figure 1:
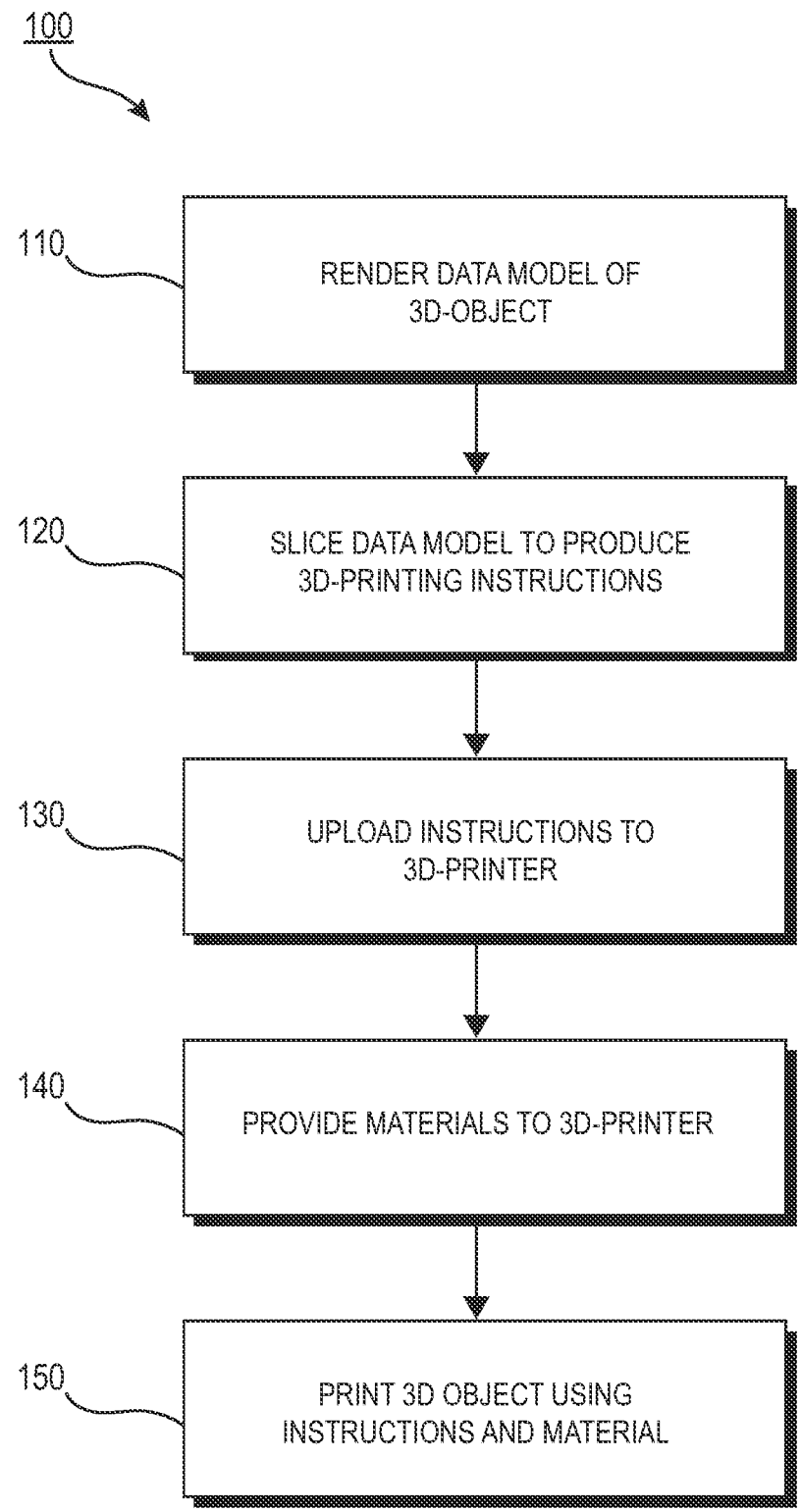
FIG. 1 is a conceptual flow diagram of an additive manufacturing process using a 3-D printer.

The detailed description set forth below in connection with the appended drawings is intended to provide a description of various exemplary embodiments of the invention and is not intended to represent the only embodiments in which the invention may be practiced. The term "exemplary" used throughout this disclosure means "serving as an example, instance, or illustration," and should not necessarily be construed as preferred or advantageous over other embodiments presented in this disclosure. The detailed description includes specific details for the purpose of providing a thorough and complete disclosure that fully conveys the scope of the invention to those skilled in the art. However, the invention may be practiced without these specific details. In some instances, well-known structures and components may be shown in block diagram form, or omitted entirely, in order to avoid obscuring the various concepts presented throughout this disclosure.

This disclosure is generally directed to Interface Nodes, which connect to components or to Linking Nodes. The Interface Nodes may have high precision features or complex geometries that allow them to perform specific functions, including creating connections to spanning structures such as tubes, structural panels, extrusions, sheet metal, and other structural members. Stated differently, Interface Nodes are structures that incorporate one or more high precision features and that connect to other components or to Linking Nodes to form a versatile and efficient arrangement of functional parts.

The Interface Nodes architecture may use a variety of connection features to enable coupling of the Interface Node to other components. In addition to component connections, the Interface Nodes may be connected to other, generally 3-D printed, nodes, referenced herein as Linking Nodes. The use of Interface Nodes to connect together preconfigured networks of components and Linking Nodes in a transport structure or other mechanized assembly has numerous advantages. Among others, the architecture disclosed in the aspects herein can streamline the manufacturing process by increasing production volume of both high-precision and lower precision parts while decreasing production costs. The Interface Nodes architecture is also robust, compact, and inherently reliable, and can therefore increase overall product quality.

Interface Nodes are generally high precision structures, meaning that they incorporate one or more complex features and functions as described herein. These features and functions, often compactly integrated into the Interface Nodes, may be defined by numerous physical properties and characteristics. Being an often complex consolidation of structures integrated into a single component, the Interface Node may include both intricate connection features and sophisticated functional capabilities. These features and capabilities enable the Interface Node to seamlessly connect with larger, lower precision components without requiring a significant sacrifice in production throughput. Specifically, from the two components, the size of the Interface Node is reduced compared to the other component, or Linking Node; to consume mass, and to reduce material consumption while printing the Interface Node.

As noted above, other components or Linking Nodes may also include relatively simple connection features configured to connect with the more sophisticated network of connection features of the Interface Node to form streamlined connections between these three structure types. While these components and Linking Nodes incorporate more basic features, they advantageously may be 3-D printed at a higher print rate. Alternatively, these components and Linking Nodes may be built using a suitable non 3-D print manufacturing technology. Candidate non 3-D print technologies for manufacturing components and Linking Nodes may include technologies incapable of producing high precision features. Advantageously, due to the relative absence of sophisticated capabilities in these components and Linking Nodes, a high-throughput, low cost manufacturing technique may often be a viable alternative for producing these structures.

In an embodiment, a Linking Node is composed of a 3-D printed metal using a fast speed, lower precision print process such as Directed Energy Deposition (DED), described further below. However, Linking Nodes are not so limited, and may be manufactured in other ways. Linking Nodes may include various features and functions, but lack the very high precision features that may be present in Interface Nodes.

In other embodiments, the Interface Node is alternatively or additionally attached directly to one or more components. The component may be cast part, a machined part, a part made using a combination of these techniques, or a part made using another conventional non 3-D printed technology. The component may also be manufactured using a higher production capacity AM technique. The Linking Node to which the Interface Node can be connected may in many instances include other features for connecting to other components. In some embodiments, a structure may not succinctly fall into only one of the three categories (Interface Node, Linking Node, component). Rather, a structure may occasionally include features found in two or more categories. These structures may be considered overlapping parts.

As noted, the Interface Nodes may also be connected to non 3-D printed components such as cast or machined components. The non 3-D printed components may themselves incorporate structures and features adapted to connect to the Interface Nodes and/or to perform one or more dedicated functions. Each of the above-described structures, including the Interface Node, Linking Node, the non-3D printed component, and if applicable the overlapping part, may be coupled together in a wide variety of configurations using connection features associated with the nodes or components.

Interface Nodes may include specific features or functions integrated into a single, relatively compact component. Interface Nodes, and the corresponding non 3-D printed components and Linking Nodes to which the Interface Nodes are connected may, using the principles described herein, advantageously may be produced at volume capacities. Thus, a higher production volume in printing Interface Nodes may be achieved over conventional techniques even where, as here, the complex features of the Interface Node would tend to slow the AM process.

This benefit is understood by first considering the conventional or current AM techniques. In the example of a vehicle, many large and cumbersome structures that include both basic features and geometries, and high precision features and geometries. Both of these basic and high precision features and geometries may be distributed across various parts of the structure. Manufacturers may use a high precision AM technique to 3-D print these cumbersome, voluminous structure. This approach is deficient in that 3-D print times for these large structures that also include complex portions is generally long. Thus, production volume may be compromised, and material consumption for printing these structures would increase.

Alternatively, conventional or current techniques may employ machining to produce high precision components or structures. As noted above, these techniques can involve extraordinarily involve high costs. Machining also has its intrinsic deficiencies. That is, machining cannot produce complex internal channels and lattice structures efficiently. In many cases, these structures are impossible to fabricate with machining.

In an exemplary embodiment, vehicle manufacturers employing the advanced techniques described herein may achieve the above benefits initially by considering the design of a structure (or set of structures) included within a vehicle. The structure may include various geometrical features distributed within or across its boundaries for performing specified functions. The structure may also be large and may embody significant volume. In the design portion phase of this exemplary embodiment, the high precision functions and connection features of the structure may be consolidated into a relatively compact Interface Node (or, in other embodiments, into a plurality of Interface Nodes), reduced in size at appropriate locations away from the interface(s). The size-reduced Interface Node may thereupon be 3-D printed using a high-precision, slower printing processes to achieve the required geometrical and material complexity of the node. Powder bed fusion, described below, may be one group of AM technologies considered for this high-precision printing. Consequently, unlike the scenario above, the high precision AM is limited to relatively small, compactified structures that retain their original functionality. Thus, production volume is not significantly compromised, if at all.

In this exemplary embodiment, the remaining portions of the structure, the design of which is now segregated from that of the Interface Node, may be manufactured using other higher-volume, potentially lower cost production methods as dictated by choice, or occasionally by necessity. These high-volume methods may include directed energy deposition (DED) or alternatively, by non 3-D printed methods such as casting, machining, etc.

Thus, by way of example, a complex structure in a vehicle may be designed and manufactured as a precise network of one or more Interface Nodes connected to other components (e.g. non-3D printed components or components printed using fast, lower precision AM techniques) and/or Linking Nodes. These other components or Linking Nodes may also include geometrical features and functions that, for example, were not consolidated into the design of the Interface Node or that are newly designed for other purposes. These geometrical features, and functions may include, for example, a relatively simple connection feature (e.g. a non-threaded connector) designed to connect to a more sophisticated connection feature of an Interface Node. In an embodiment, the component may be a cast component. In addition, Linking Nodes may be designed at this stage, and 3-D printed thereafter, in order to achieve a custom connection, or superior load characteristics, for the remaining components and structures not consolidated in the design of the integrated node.

It should be noted that the above design description is exemplary in nature. For example, while the above embodiment discusses primarily a single structure, the technique described herein may equally well apply to a set or plurality of structures, along with one or more corresponding components, Interface Nodes, and Linking Nodes. Design approaches for an application may also vary depending on the nature of the component(s), the manufacturing objective, and other factors.

Also, at this stage of the design process and alternatively or in addition to the Interface Nodes, one or more Linking Nodes may be produced using an appropriate technique (such as DED). A Linking Node is a node or joint member whose principal purpose is to connect one or more Interface Nodes with one or more other components, such as the more voluminous, fast-AM printed or non-3D printed components discussed above. Although a key function of the Linking Node is to connect the Interface Node(s) with the component(s), the Linking Nodes may also include basic features for performing other functions. For example, the Linking Node may have basic connection features that may enable the Interface Node(s) to easily connect via the Linking Node to the other components, including the fast-printed and non-3D printed components. Nevertheless, the Linking Node lacks the high-precision, high-performance component(s) embodied in an Interface Node. That difference however, generally allows the Linking Node to be manufactured using a faster and potentially lower cost method.

In short, the Interface Node(s) may be produced at a reduced size using a high precision, slow printing process. Lower precision, more flexible printing methods, or non 3-D printing methods, may be employed for components of the design whose inherent features allow for these methods. While the functional and structural sophistication of the Interface Node generally requires the slow printing process, the segregation of the parts as described above means that the portions to be printed are substantially reduced in size.

As a simple example, an Interface Node may be produced using a high precision, high feature, slow printing process AM solution. The Interface Node may include a connection feature, such as a protruding circular surface for welding to a Linking Node. The Linking Node may be produced, for example, using a faster, lower cost manufacturing process that may not accommodate all the feature capability and precision associated with the Interface Node, but that enables a high production volume (such as high-speed AM or a conventional non 3-D method). The non 3-D printed (or fast-printed) component may include a portion of the original structure(s) from which features of the Interface Node were extracted during the design process. The component may also include another part in the vehicle (such as a transmission housing, an interior panel, an engine block, to name a few). The component may be redesigned as necessary after which, it may be further designed to connect to the Interface Node, via a Linking Node or directly. From this basic design framework, an entire vehicle or other transport structure may be constructed as a precision network of Interface Nodes all interconnected via Linking Nodes or components.

It should be noted that the design phase is versatile and may involve a number of different approaches than the example above. For instance, Interface Nodes and Linking Nodes need not be derived from other components. In other embodiments, Interface Nodes may be independently derived in the design phase by selecting one or more high precision features and incorporating them into a compact part in a suitable manner. For example, Interface Nodes (and if necessary, Linking Nodes) may be used to form a section or portion of the vehicle in a variety of ways, such as by forming a network of Interface Nodes connected by carbon tubes, as illustrated with reference to FIG. 6A-C, below.

As is evident from the aforementioned examples, the advantages obtained based on the design and use of the feature-rich Interface Nodes are numerous. The design in one embodiment involves identifying the features of a structure whose features or material properties require high precision, slow printing AM. Once the precision features are so identified, they can be consolidated into a relatively small volume, and the remaining, typically more-voluminous portions of the design are segregated. Upon identifying these remaining voluminous portions, they can be reshaped or reconstructed as necessary (subject to any inherent functional or physical constraints) to accommodate an ideal fit in the transport structure while also addressing any thermal properties, material properties (such as characteristics of materials given the application, or the effect of different materials) or other considerations. Thereupon, they can be manufactured using a faster and less expensive method in the form of components and, where necessary or desirable, Linking Nodes.

The Interface Nodes that require more sophisticated structural or functional features may be printed using certain suitable AM technologies, with the print speed being reduced to a sufficiently slow rate to enable the successful rendering of these generally higher-precision structures. The physical size of these structures may be reduced or otherwise constrained to a target volume that maintains their functional utility or structural integrity, while maximizing volume production speed. In an embodiment, the structure is only reduced in size in areas not adjacent the interface(s) of the Interface Node. Thus, the connection features at the interface portion maintain their regular sizes. Thus, while the integrated structure's incorporating more sophisticated functions may slow the 3-D rendering speed, the concurrent reduction in the size of the structure to be printed may restoratively increase the potential losses in production volume. The overall sacrifice in production speeds may therefore be reduced, if not made minimal to negligible.

Material properties. Interface Nodes may have different material properties than the components or Linking Nodes to which they connect. A lower-speed print may be used in the production of the Interface Node that needs certain material properties that are not available in a higher throughput technology. For example, an Interface Node may require higher yield strength than the Linking Node. In this case, the Linking Node can be produced through casting or through a faster rate AM process, but the Interface Node cannot be produced with these methods because as noted, it requires superior material properties. Other examples of material property requirements that may affect the manufacturing process of the Interface Node include improved thermal conductivity, better ultimate strength, and better elongation.

While the integrated structure incorporating these Interface Nodes may provide particular benefits for manufacturers of transport structures such as vehicles, busses, trains, aircraft, spacecraft, satellites, motorcycles, ships, boats, public transportation structures, and the like, the disclosure is not so limited and the Interface Nodes and corresponding structures may apply to a variety of mechanized assemblies of which transport structures constitute only a subset. Those skilled in the art will appreciate that AM and its attendant benefits are progressively expanding into a number of diverse industries, with AM technologies having the potential to advance the state of the art in the development of new technologies in these industries.

Manufacturing Processes. Depending on the industry, the type of structures being produced, and potentially other factors, certain types of manufacturing processes may be preferred or desirable. These include both additive manufacturing and conventional, subtractive manufacturing techniques. While various techniques and categories of techniques are referenced herein, it should be understood that the present disclosure is not so limited to these processes and that one skill in the art will appreciate that numerous other types of manufacturing methods may be possible. Generally, to accommodate the types of structures discussed in this disclosure—Interface Nodes, components, and Linking Nodes, they may be manufactured using various classes of processes. Some non-exhaustive examples include:

High precision, lower throughput Additive Manufacturing—these types of manufacturing process may include AM techniques that are high precision in that that they can print sophisticated features, complex geometrical structures, and parts with multi-faceted functional capabilities. In AM, the throughput is generally lower because for the 3-D printer to render such detail, especially where low feature sizes and small layer heights are involved, the process takes longer. In addition, there may be various limitations on the types of high precision features that these techniques can provide.

High precision, high feature, lower throughput Additive Manufacturing—This category of manufacturing techniques may include certain powder bed fusion 3-D printing techniques that are high precision in that they can render sophisticated features, complex geometrical structures, and parts with multi-faceted functional capabilities. This category may also include high feature capability, which means that there may be relatively few limitations on the types of structures that can be manufactured using these process as compared with other processes. High precision features of a wide variety, and not just a few types of high precision features, may be within the capability of these techniques. In AM, the techniques are generally lower throughput because for the 3-D printer to render such detail, especially where low feature sizes and small layer heights are involved, the process takes longer. This category is to be contrasted with two exemplary, widely used non 3-D printed manufacturing techniques set forth below.

Casting—unlike the above, casting is a non-AM technique that is generally categorized a lower precision technology with a low feature capability. Casting may include other advantages. The general limitations on both level of precision and limited feature types may make casting unsuitable for certain applications. However, casting may be capable of producing large structures with basic features using a high throughput, in contrast to the above low-throughput techniques. In addition, casting can be cost effective, especially for large structures with relatively basic features. Casting is not a good candidate for structures anticipated to undergo numerous structural changes, in that a new cast is required for each new structure, driving up costs and making the entire process more time consuming.

Machining—In contrast to casting, machining techniques can be used to make very high precision structures, but machining generally is a low feature process in that it inherently lacks the ability to produce certain kinds of features that can be produced by more design independent processes. Machining cannot produce complex internal channels or lattice structures efficiently. In many cases, these structures are impossible to fabricate with machining. Also, machining can be very expensive.

High throughput printing—certain Additive Manufacturing techniques may be performed using a high throughput. An example includes directed energy deposition (DED), which does not need a powder bed to slow the process. DED is also design independent and can produce many features. DED, however, is generally lower precision and therefore may be optimal for making metal structures with basic features (such as Linking Nodes).

Many other techniques are available, and certain classes of these techniques are disclosed herein. Each are candidates for making structures that fall within the scope of this disclosure. However, other manufacturing techniques, not specifically disclosed herein, may also be possible. For example, forging may be used to produce components.

An important aspect in a designer's choice of manufacturing techniques is the required material properties that a process is capable of providing. For example, Interface Nodes may have substantially different material properties over those of components or Linking Nodes to successfully perform the functions for which it is designed. For example, certain Interface Nodes may be used to dissipate thermal energy. Thus the material properties of the Interface Node may be significantly different from, say, a Linking Node or a component whose principle function may be to connect to another component or to transfer a load. Thus, in choosing a manufacturing technique, material properties generally must be considered.

In an aspect of the disclosure, Linking Nodes may be used to connect Interface Nodes to other components. For example, an Interface Node may be printed and connected to a Linking Node. The Linking Node may, in an embodiment, be constructing using DED or another generally high throughput technique. The Linking Node may include, for example, a block of material operable to encompass and securely affix to a necessary size of an interface. Thus, using Linking Nodes, Interface Nodes may be coupled to many different types of components.

It should be noted that the low precision components described above may and typically do include physical and geometrical functions and features. In an aspect of the disclosure, the high precision features are integrated into a separate, manageably-sized component (the Interface Node) that may include connection features, such as a surface for subsequent material deposition or another connector, to interface with one or more other structures. In an embodiment, the one or more other structures may be a large part which includes lower precision functional and/or structural features that are generally amenable to straightforward, relatively low cost construction using casting, machining or other techniques, and that are generally amenable to straightforward redesigns.

As an example of conventional challenges faced by manufacturers of transport structures, many essential components of a transport structure (such as a transmission) in general are shaped in a predetermined manner, and include networks of complex and unique features, functions, and geometries. A hypothetical manufacturer tasked with designing and assembling a large complex structure for a vehicle may attempt to produce the structure with detailed internal geometries using a casting technique. Due to the size of the structure and the large number of precision features, the manufacturer will likely invest a substantial sum of money (a sum which likely increases with the sophistication and size of the structure) to produce a mold for the casting. This design process typically involves, among other tasks, manpower for procuring materials to make the mold, evaluating the mold design, incorporating feedback from the design team, and refining the mold design based on the feedback until the final mold is capable of forming the structure. It should be noted, depending on the type of structure and its level of complexity, material requirements, tolerances, geometries, etc., that the manufacturer may also have to identify and define other manufacturing technologies to use in conjunction with the casting or to use at some point during the process in order to enable successful completion of all the features of the structure, including any internal features. Machining or milling may be required. In these events, the manufacturing process may entail significant manufacturing design and preparation time, and the structure may be required to pass through a number of assembly steps using different manufacturing techniques before the final product is ready. In short, while the project may be successful, the structure would no longer be capable of being produced using high throughput at volume capacities. This is a clear disadvantage.

The manufacturer is thereafter faced with additional challenges. One potentially significant problem is where the structure needs a design change. Depending on the sophistication of the change, this may entail at the very least changing the mold, which may result in additional expenditures and resources to accommodate the redesign. Depending on factors like the location of the change, even with a relatively simple change (e.g. widening a wall by 5 mm), the redesign may still be complex.

Therefore, the manufacturer may successfully build a complex product, but at the expense of time, money, and significant inflexibility in that any modifications needed thereafter to the structure may involve a complex and costly mold redesign. In sum, as is evident from this example, the construction of a complex structure using conventional manufacturing techniques may be a low throughput process that results in significant expenses along with potential inflexibilities in the event the design is to evolve, or an error is to be corrected.

In recognition of the potential deficiencies of the above-described procedure, the manufacturer may instead attempt to use AM to render the entire structure. Advantageously, unlike the casting method, AM is not design specific and certain AM technologies can flexibly produce structures with highly sophisticated custom geometries. However, this solution may not be optimal. In the above example where the structure is large, the corresponding chunk of material needed to construct the structure may be too voluminous to fit into the build chamber of the particular AM technology needed. Where it does fit the build chambers (the sizes of which are constantly increasing), the rendering of the structure is nevertheless time-consuming in many AM technologies of choice, and cannot be performed at volume. During this time, the 3-D printer cannot be used for other tasks.

Accordingly, a solution to the above problem in one aspect of the disclosure is to construct an architecture such that the high precision features, i.e., the sophisticated features and attributes of the structure, are consolidated into a manageably-sized Interface Node. The Interface Node may be manufactured using powder bed fusion or another technique capable of very high precision printing. Essentially, an AM Interface Node may congregate the geometries of various subcomponents in a complex structure into one functioning unit. In an embodiment, all of the key complexity and functionality is built into that one unit. Conversely, the remaining bulk of the structure, which includes straightforward geometries and functions, may be produced at high volume using a conventional technique or a high volume AM process. The Interface Node may thereupon be coupled to the bulk structure, such as a cast structure, either directly using connection features or through a Linking Node as described herein. This aspect of the disclosure provides significant flexibility in that, among other advantages described throughout various embodiments herein, design changes may be easily accommodated, whether in the Interface Node or the larger counterpart to the structure, because both parts can separately be manufactured at a lower cost and a high volume and because of the design-independent nature of the AM process. In addition, the Interface Node may be attached to multiple parts and may incorporate the functions of other components. In this way, design flexibility is significantly enhanced.

The design phase of this aspect of the disclosure provides the designer with a choice whether to integrate a relevant function (and structural portion thereof) into the Interface Node or instead into the traditionally manufactured component. In an exemplary embodiment, the choice is based on an optimization of (i) maximum throughput of the overall production process, (ii) relative technical capabilities of the manufacturing processes selected to produce the Interface Node and traditionally manufactured part, (iii) the relative costs associated with manufacturing the structural portion at issue in the respective components, and (iv) other considerations such as the overall system design of which the Interface Node and traditionally-made component will be included, the ease or difficulty and likelihood of redesign, etc.

Additive Manufacturing (3-D Printing). A variety of different AM techniques have been used to 3-D print components composed of various types of materials. Numerous available techniques exist or are being developed. For example, Directed Energy Deposition (DED) AM systems use directed energy sourced from lasers, electron beams, or other energy sources to melt metal. These systems utilize both powder and wire feeds. The wire feed systems, in which wire of a given material is ejected from a feed mechanism during the deposition, advantageously have higher deposition rates than other prominent AM techniques. Single Pass Jetting (SPJ) combines two powder spreaders and a single print unit to spread metal powder and to print a structure in a single pass with apparently no wasted motion. As another illustration, electron beam additive manufacturing processes use an electron beam to deposit metal via wire feedstock or sintering on a powder bed in a vacuum chamber. Atomic Diffusion Additive Manufacturing (ADAM) is still another recently developed technology in which components are printed, layer-by-layer, using a metal powder in a plastic binder. After printing, plastic binders are removed and the entire part is sintered at once into a desired metal.

FIG. 1 is a flow diagram 100 illustrating an exemplary process of 3-D printing. A data model of the desired 3-D object to be printed is rendered (step 110). A data model is a virtual design of the 3-D object. Thus, the data model may reflect the geometrical and structural features of the 3-D object, as well as its material composition. The data model may be created using a variety of methods, including CAE-based optimization, 3D modeling, photogrammetry software, and camera imaging. CAE-based optimization may include, for example, cloud-based optimization, fatigue analysis, linear or non-linear finite element analysis (FEA), and durability analysis.

3-D modeling software, in turn, may include one of numerous commercially available 3-D modeling software applications. Data models may be rendered using a suitable computer-aided design (CAD) package, for example in an STL format. STL is one example of a file format associated with commercially available STL-based CAD software. A CAD program may be used to create the data model of the 3-D object as an STL file. Thereupon, the STL file may undergo a process whereby errors in the file are identified and resolved.

Following error resolution, the data model can be "sliced" by a software application known as a slicer to thereby produce a set of instructions for 3-D printing the object, with the instructions being compatible and associated with the particular 3-D printing technology to be utilized (step 120). Numerous slicer programs are commercially available. Generally, the slicer program converts the data model into a series of individual layers representing thin slices (e.g., 100 microns thick) of the object be printed, along with a file containing the printer-specific instructions for 3-D printing these successive individual layers to produce an actual 3-D printed representation of the data model.

The layers associated with 3-D printers and related print instructions need not be planar or identical in thickness. For example, in some embodiments depending on factors like the technical sophistication of the 3-D printing equipment and the specific manufacturing objectives, etc., the layers in a 3-D printed structure may be non-planar and/or may vary in one or more instances with respect to their individual thicknesses. For example, in some exemplary embodiments, a build piece may be additively manufactured using PBF, after which DMD may be applied to change a region of the build piece using a non-flat layer structure and/or layers having different thicknesses.

A common type of file used for slicing data models into layers is a G-code file, which is a numerical control programming language that includes instructions for 3-D printing the object. The G-code file, or other file constituting the instructions, is uploaded to the 3-D printer (step 130). Because the file containing these instructions is typically configured to be operable with a specific 3-D printing process, it will be appreciated that many formats of the instruction file are possible depending on the 3-D printing technology used.

Different AM processes may include different features. Shown in Table I below is an example of certain AM technologies and their various capabilities.

| AM Technology | Feature Size | Print Speed/ throughput | Feedstock |
| --- | --- | --- | --- |
| Material Extrusion | 125 microns | 1-3 cm/hr (along z axis) | Thermoplastic materials |
| Vat Photopolymerization | 25 microns | 1-3 cm/hr (along z axis) | Photopolymer materials |
| Material Jetting | 30 microns | 200-300 ml/hr | Polymers |
| Laser Powder Bed Fusion | 50 microns | 1-105 ml/hr | Powdered metals, alloys, polymers |
| Electron Beam Powder Bed Fusion | 300 microns | 55-80 ml/hr | Powdered metals, alloys |
| Sheet Lamination | As machined | 300-500 ml/hr | Metal/alloy sheet or strips |
| Binder Jetting (BJ) | 60 microns | 1435 ml/hr | Metallic, non-metallic powders including composites, ceramics |
| Directed Energy Deposition (DED) | 1000-3000 microns | 3-10 kg/hr | Wire and powder feed metals and alloys |
| Atomic Diffusion Additive Manufacturing | 40 microns | 2000 ml/hr | Metal Injection Molding (MIM) materials |
| Digital Light Synthesis | 75 microns | 25-300 cm/hr (Along z axis) | Photopolymers |
| Stereo-electrochemical Deposition | 25 microns | 15 kg/hr | Metal ion solutions |
| Composite-based Additive Manufacturing Technology | 40 microns | 737 ml/hr | Fiber reinforced composite sheets |
| Single Pass Jetting | 50 microns | 8200 ml/hr | Metal Injection Molding (MIM) materials |

The units in the Print Speed/throughput column are different based on what is used in the industry. For example, plastic printing uses cm/hr. PBF systems use vol./hr and so on. Additionally, it is expected that Print Speed/throughput will raise substantially with the development of technologies for AM.

In addition to the printing instructions that dictate what and how an object is to be rendered, the appropriate physical materials necessary for use by the 3-D printer in rendering the object are loaded into the 3-D printer using any of several conventional and often printer-specific methods (step 140). In DMD techniques, for example, one or more metal powders may be selected for layering structures with such metals or metal alloys. In selective laser melting (SLM), selective laser sintering (SLS), and other PBF-based AM methods (see below), the materials may be loaded as powders into chambers that feed the powders to a build platform. Depending on the 3-D printer, other techniques for loading printing materials may be used.

The respective data slices of the 3-D object are then printed based on the provided instructions using the material(s) (step 150). In 3-D printers that use laser sintering, a laser scans a powder bed and melts the powder together where structure is desired, and avoids scanning areas where the sliced data indicates that nothing is to be printed. This process may be repeated thousands of times until the desired structure is formed, after which the printed part is removed from a fabricator. In material extrusion AM processes, as described above, parts are printed by applying successive layers of model and support materials to a substrate. In general, any suitable 3-D printing technology may be employed for purposes of this disclosure.

Another AM technique includes powder-bed fusion ("PBF"). Like DMD, PBF creates 'build pieces' layer-by-layer. Each layer or 'slice' is formed by depositing a layer of powder and exposing portions of the powder to an energy beam. The energy beam is applied to melt areas of the powder layer that coincide with the cross-section of the build piece in the layer. The melted powder cools and fuses to form a slice of the build piece. The process can be repeated to form the next slice of the build piece, and so on. Each layer is deposited on top of the previous layer. The resulting structure is a build piece assembled slice-by-slice from the ground up.

FIGS. 2A-D illustrate respective side views of an exemplary PBF system 200 during different stages of operation. As noted above, the particular embodiment illustrated in FIGS. 2A-D is one of many suitable examples of a PBF system employing principles of this disclosure. It should also be noted that elements of FIGS. 2A-D and the other figures in this disclosure are not necessarily drawn to scale, but may be drawn larger or smaller for the purpose of better illustration of concepts described herein. PBF system 200 can include a depositor 201 that can deposit each layer of metal powder, an energy beam source 203 that can generate an energy beam, a deflector 205 that can apply the energy beam to fuse the powder, and a build plate 207 that can support one or more build pieces, such as a build piece 209. PBF system 200 can also include a build floor 211 positioned within a powder bed receptacle. The walls of the powder bed receptacle 212 generally define the boundaries of the powder bed receptacle, which is sandwiched between the walls 212 from the side and abuts a portion of the build floor 211 below. Build floor 211 can progressively lower build plate 207 so that depositor 201 can deposit a next layer. The entire mechanism may reside in a chamber 213 that can enclose the other components, thereby protecting the equipment, enabling atmospheric and temperature regulation and mitigating contamination risks. Depositor 201 can include a hopper 215 that contains a powder 217, such as a metal powder, and a leveler 219 that can level the top of each layer of deposited powder.

Figure 2A:
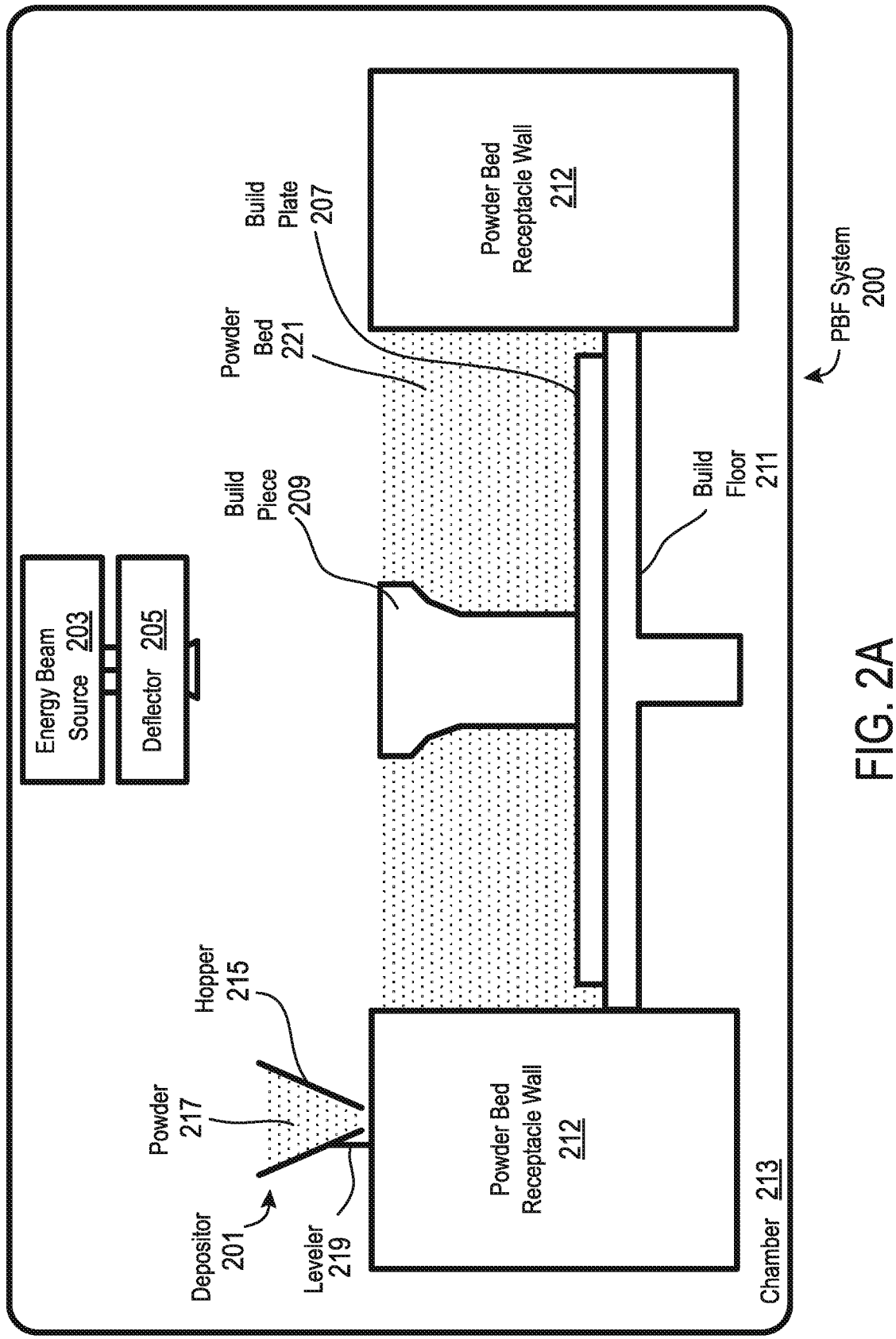
FIGS. 2A-D illustrate an exemplary powder bed fusion (PBF) system during different stages of operation.

Referring specifically to FIG. 2A, this figure shows PBF system 200 after a slice of build piece 209 has been fused, but before the next layer of powder has been deposited. In fact, FIG. 2A illustrates a time at which PBF system 200 has already deposited and fused slices in multiple layers, e.g., 150 layers, to form the current state of build piece 209, e.g., formed of 150 slices. The multiple layers already deposited have created a powder bed 221, which includes powder that was deposited but not fused.

Figure 2B:
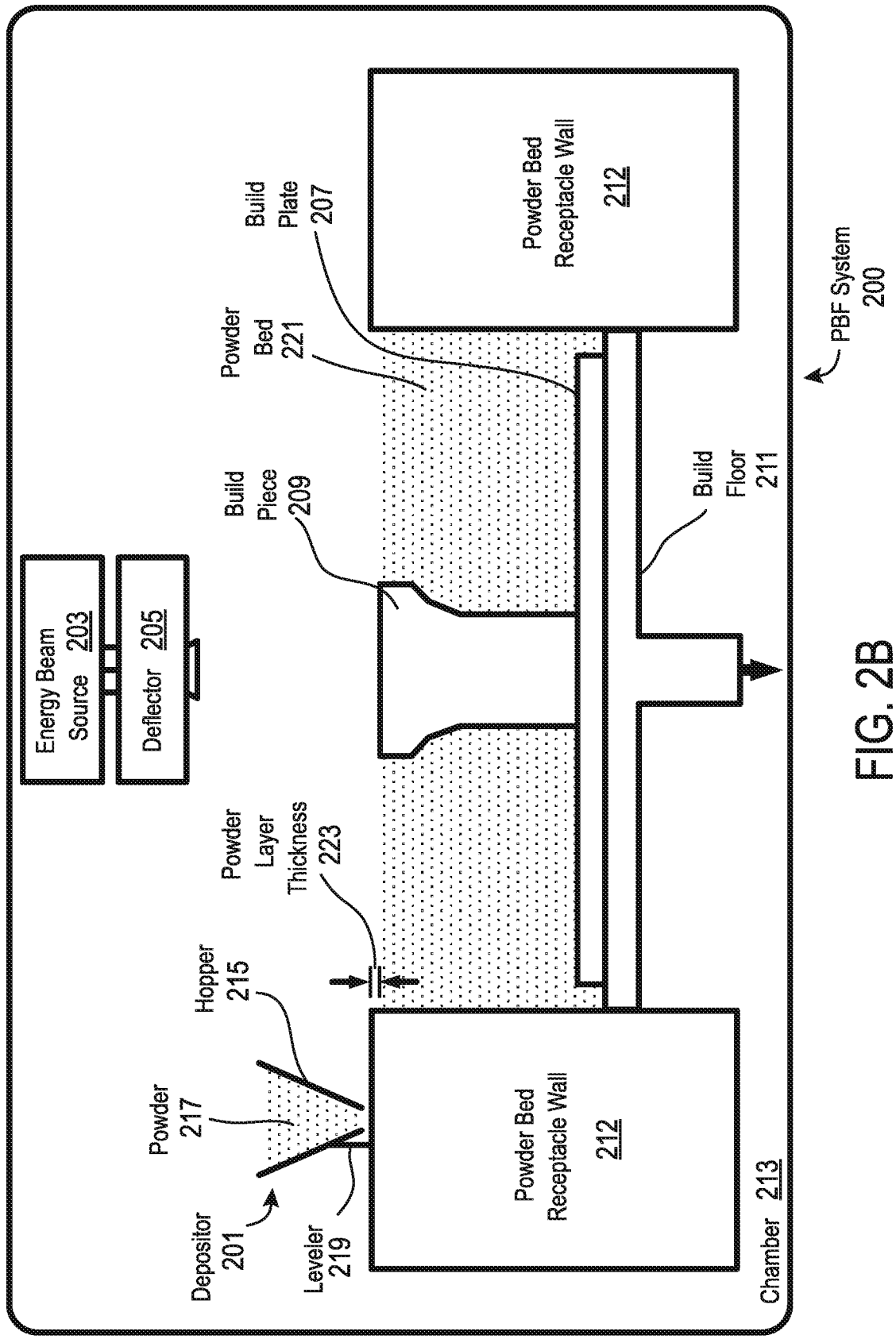

FIG. 2B shows PBF system 200 at a stage in which build floor 211 can lower by a powder layer thickness 223. The lowering of build floor 211 causes build piece 209 and powder bed 221 to drop by powder layer thickness 223, so that the top of the build piece and powder bed are lower than the top of powder bed receptacle wall 212 by an amount equal to the powder layer thickness. In this way, for example, a space with a consistent thickness equal to powder layer thickness 223 can be created over the top of build piece 209 and powder bed 221.

Figure 2C:
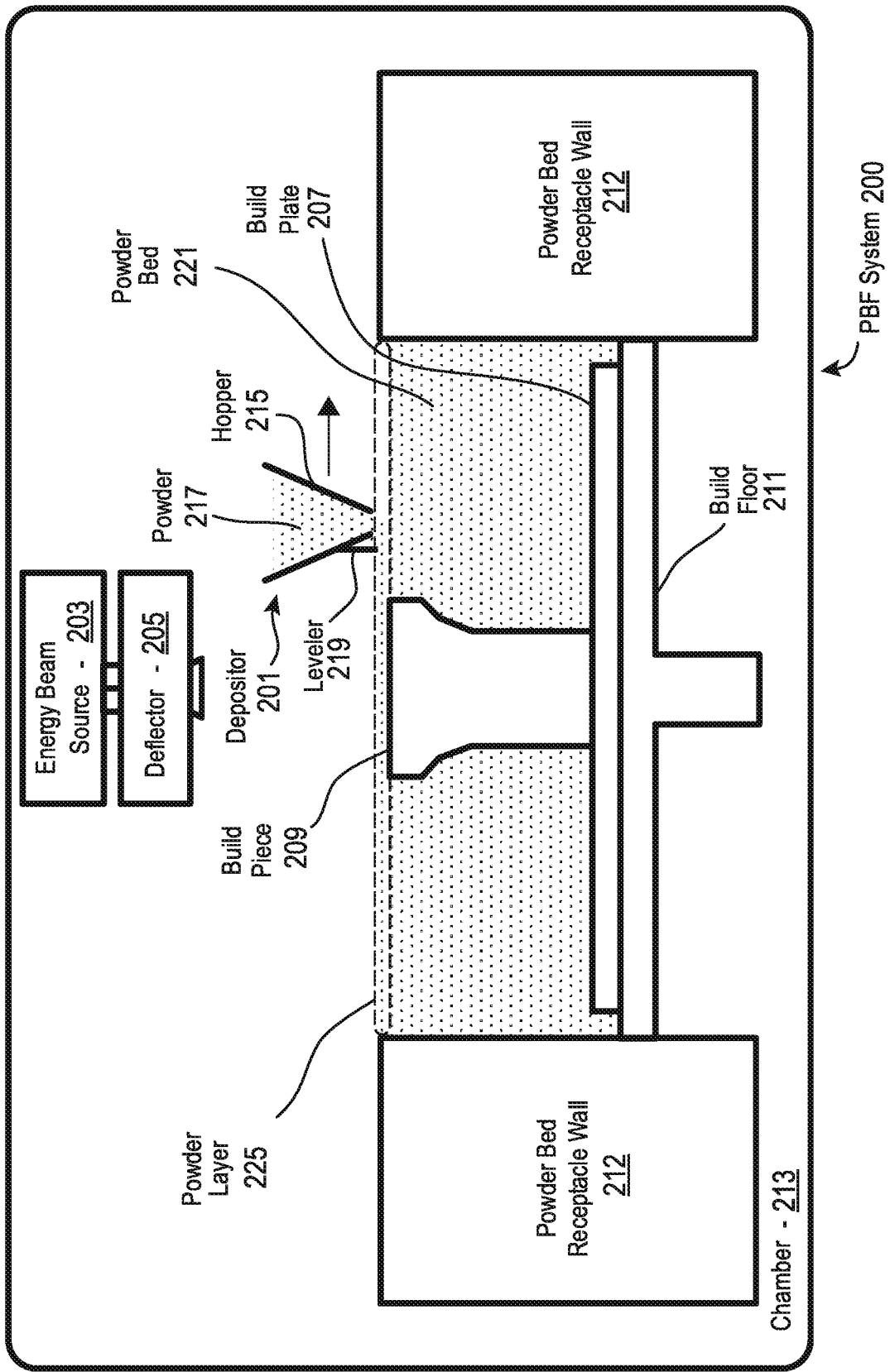

FIG. 2C shows PBF system 200 at a stage in which depositor 201 is positioned to deposit powder 217 in a space created over the top surfaces of build piece 209 and powder bed 221 and bounded by powder bed receptacle walls 212. In this example, depositor 201 progressively moves over the defined space while releasing powder 217 from hopper 215. Leveler 219 can level the released powder to form a powder layer 225 that has a thickness substantially equal to the powder layer thickness 223 (see FIG. 2B). Thus, the powder in a PBF system can be supported by a powder support structure, which can include, for example, a build plate 207, a build floor 211, a build piece 209, walls 212, and the like. It should be noted that the illustrated thickness of powder layer 225 (i.e., powder layer thickness 223 (FIG. 2B)) is greater than an actual thickness used for the example involving 250 previously-deposited layers discussed above with reference to FIG. 2A.

Figure 2D:
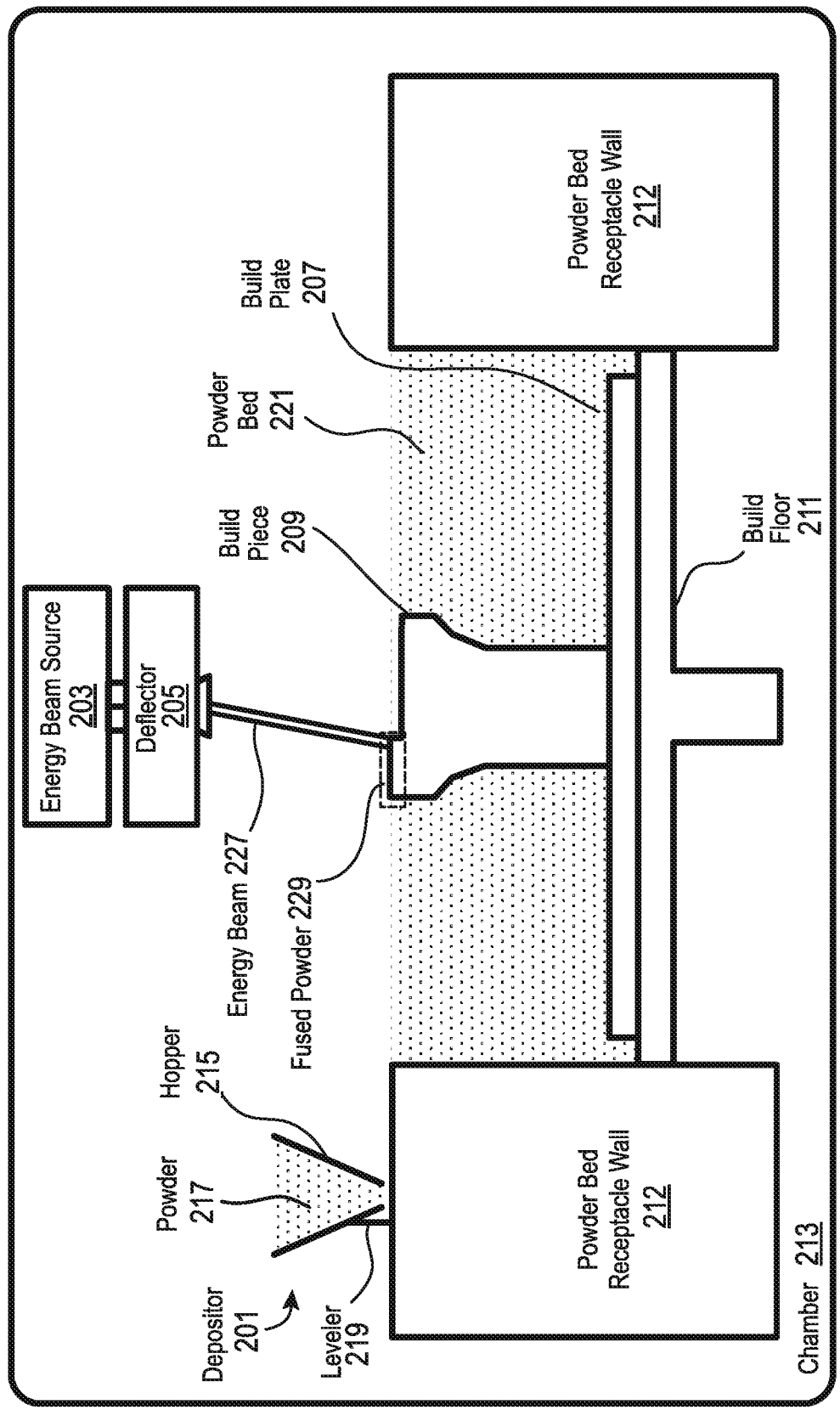

FIG. 2D shows PBF system 200 at a stage in which, following the deposition of powder layer 225 (FIG. 2C), energy beam source 203 generates an energy beam 227 and deflector 205 applies the energy beam to fuse the next slice in build piece 209. In various exemplary embodiments, energy beam source 203 can be an electron beam source, in which case energy beam 227 constitutes an electron beam. Deflector 205 can include deflection plates that can generate an electric field or a magnetic field that selectively deflects the electron beam to cause the electron beam to scan across areas designated to be fused. In various embodiments, energy beam source 203 can be a laser, in which case energy beam 227 is a laser beam. Deflector 205 can include an optical system that uses reflection and/or refraction to manipulate the laser beam to scan selected areas to be fused.

In various embodiments, the deflector 205 can include one or more gimbals and actuators that can rotate and/or translate the energy beam source to position the energy beam. In various embodiments, energy beam source 203 and/or deflector 205 can modulate the energy beam, e.g., turn the energy beam on and off as the deflector scans so that the energy beam is applied only in the appropriate areas of the powder layer. For example, in various embodiments, the energy beam can be modulated by a digital signal processor (DSP). It should be noted that the PBF process can be performed without a re-coater blade as well.

Directed Energy Deposition (DED). Directed Energy Deposition (DED) is an AM technology primarily used to create structures from metals and alloys. This technique is used for both creating 3-D structures and for repairing existing structures. DED can be used for directly depositing material onto existing AM components. DED deposits material via a powder depositor or a wire feedstock.

Figure 3A:
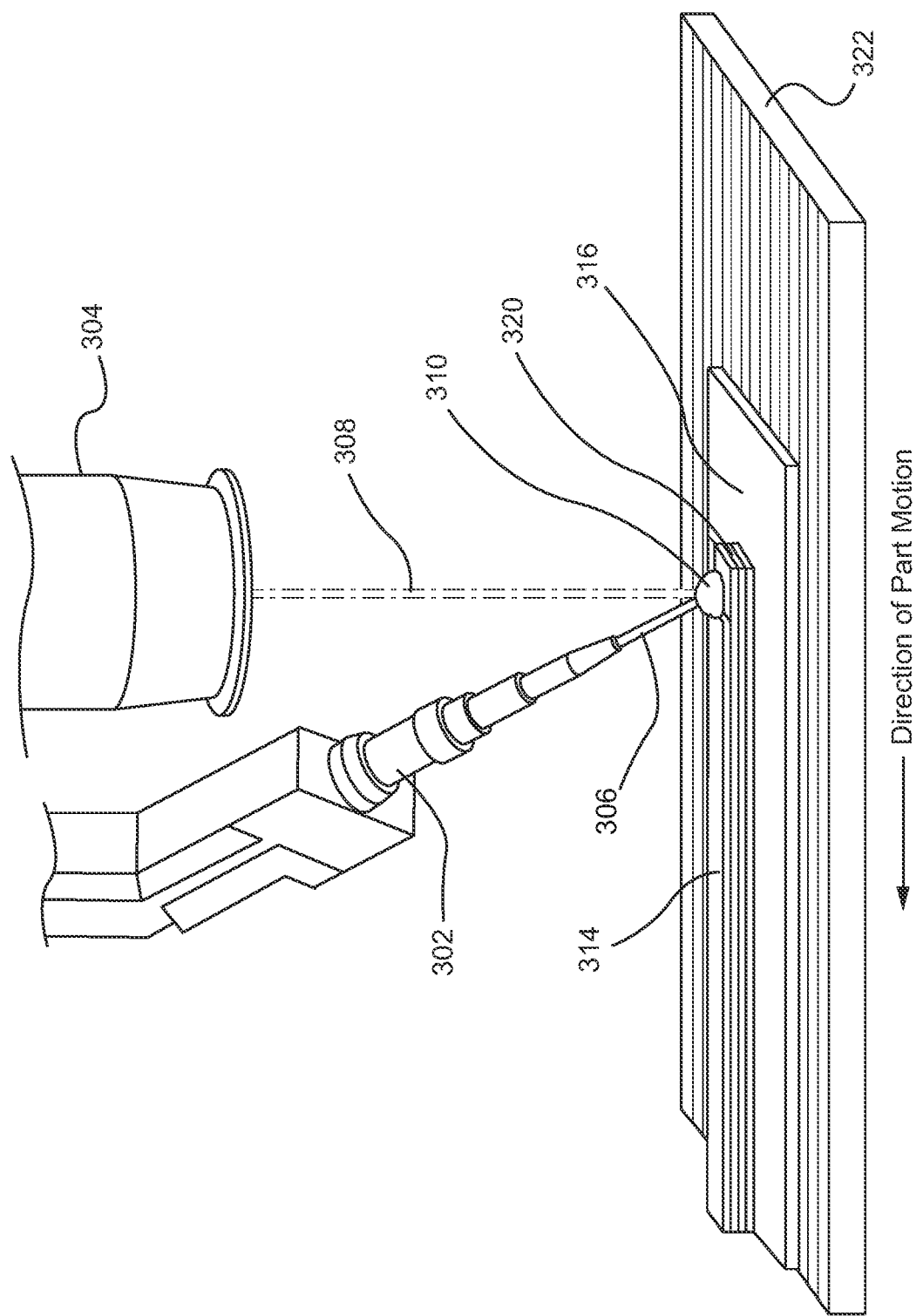
FIG. 3A illustrates an exemplary Directed Energy Deposition (DED) system.

FIG. 3A illustrates an exemplary Directed Energy Deposition (DED) system 300. In this example, a wire feedstock is used to supply material for the build piece, although a powder depositor may be used instead. DED system 300 includes a wire feeder 302 for ejecting wire material 306. Wire feeder 302 may be mounted on a multi-axis arm and, unlike several other AM techniques, can generally move along multiple axes. The build piece 314 may be disposed on a substrate 316, which need not be a flat surface and which in some embodiments may constitute a surface region of a node or other component.

FIG. 3A further includes electron beam gun 304 (or in other embodiments, a high power laser beam source). Electron beam gun 304 emits an electron beam 308 that melts the wire material 306 via the high power radiation into a molten puddle 310. As noted, in other embodiments, different energy sources may be used in lieu of electron beam gun 304. Most notably, a laser may be used, although other energy sources including an electric arc are also possible. The build piece 314 may build on the substrate 316 in layers 320, starting at the substrate and moving upward. The wire feeder 302 may project the wire material 306 onto the target surface from essentially any angle as a result of the multi-axis arm. The electron beam 308 may be directed towards the wire material 306 immediately after its deposition on the target surface to melt the deposited material and create the molten puddle 310. The molten puddle 310 may then solidify.

The desired shape of the build piece may be formed by controlling the feed rate of the wire material 306 from wire feeder 302 and the angle from which the metal 306 is deposited on the surface. In this exemplary embodiment, the build piece 314 is moved by a movable plate 322 from the right to the left as the material 306 is ejected from the wire feeder 302. As noted above, the deposition, melting, and solidification of the material 306 may be performed on a layer by layer basis to produce the build piece 314.

One advantage of DED is that the technology can also be used to create build pieces including chunks of a single metal or alloy material directly on surfaces of other parts. These uniform build pieces may have various uses in a vehicle, for example, where solid metal parts are required such as impact structures in a vehicle. Moreover, unlike conventional manufacturing techniques, benefits of DED include its accuracy and high resolution capability. The grain structure of the depositing wire 306 can generally be controlled with significant precision, which in turn allows fabricating build pieces with detailed and accurate features.

The structural composition of current DED systems can vary. For example, in some DED systems, the material depositor is structurally separate from the energy source. In other DED systems, the material depositor and energy source are part of the same apparatus. An example of the latter implementation includes MIG ("metal inert gas welding") based DED. In MIG welding, an electric arc (e.g., short arc, spray arc, etc.) may be established between the workpiece and a wire electrode. The arc provides a DC current and voltage that continuously melts the wire as the wire is fed to the weld pool.

Figure 3B:
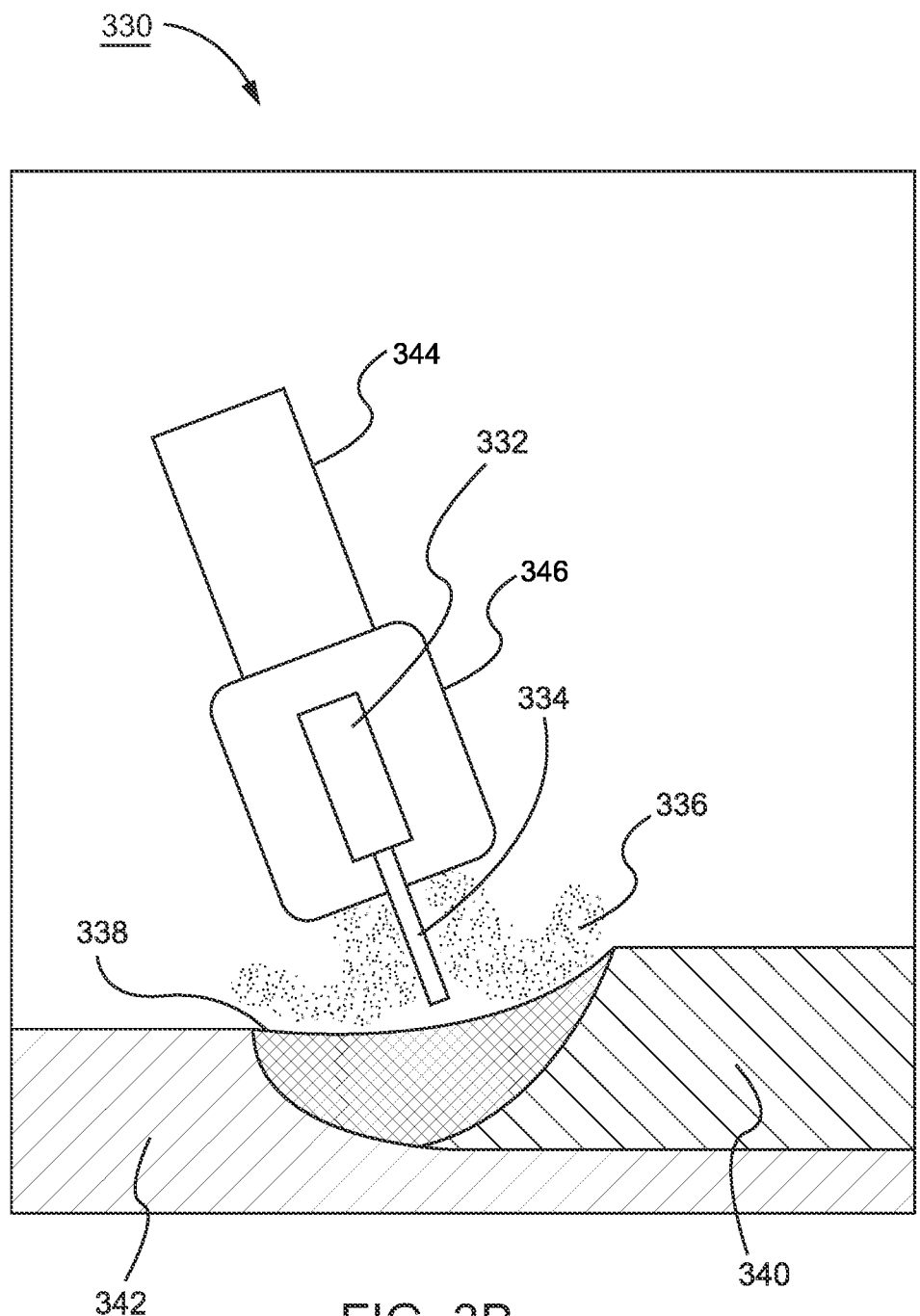
FIG. 3B illustrates an exemplary MIG welding based DED system.

FIG. 3B illustrates an exemplary MIG welding based DED system 330. The MIG system 330 may include a welding torch 346 for generating the arc, wire material source 344 for providing the wire material 334, and a contact sleeve 332 for guiding the wire material 334 to the welding point. The MIG system 330 may deposit wire material 334 from the wire material source 344 onto a substrate 342 or other workpiece surface, which may generally include any suitable metal surface region.

The wire material 334 may in some configurations be provided by a motorized reel located in wire material source 344. The wire material 334 may be guided to the desired welding point using the contact sleeve 332. The wire material 334 melts quickly as a result of the heat created by the electric arc. During the MIG welding process, inert shielding gas 336 may be added via a separate extruder (not shown). This prevents oxygen from penetrating the weld pool 338 and therefore protects against potentially harmful oxidation. The finished weld or bead 340 results as the MIG-based DED system continues along the surface of the substrate 342 to deposit the resulting layer of metallic material. While the MIG DED system described in FIG. 3B uses an electric arc, other energy sources may be integrated within a single DED system, including a laser and electron beam, etc.

AM Interface Nodes and conventionally manufactured components. In one aspect of the present disclosure, techniques to connect conventionally manufactured components with AM Interface Nodes are disclosed. An Interface Node (also referred to herein as a "node") is, first and foremost, a node that may be used to provide interfaces between different types of components. For purposes of these embodiments, the interface may be between the Interface Node and the conventionally manufactured component or the Linking Node. In some embodiments, an Interface Node includes connection features, each of which may interface with a complementary interface of another component.

The conventionally manufactured component may have a relatively simple geometry and features to reduce tool design lead time and associated costs. In an exemplary embodiment, the simple geometry and features facilitate high-throughput manufacturing of the component. In another exemplary embodiment, the high-throughput manufactured component may be heavy and voluminous, and may comprise a significant portion of the assembly or subassembly of the transport structure or other mechanized assembly. The Interface Nodes may be high precision, meaning that they can embody complex and sophisticated structural features and attributes that may be costly to manufacture using conventional means. These features and attributes may include both the connection feature and other attributes of the Interface Node. As another illustration, high precision Interface Nodes may be made of a specialized material designed to withstand a certain thermal environment. The complex features of a high precision Interface Node may be geometrical/structural in nature, or they may involve finely tuned tolerances or material requirements. They may also include specialized geometrical structures composed of one or more materials desirable for a particular application. As described above, high precision components involving intricate structures or configured to perform special functions may generally be associated with a low production volume, because lower production speeds are typically needed to accurately render fine details and complex geometries. AM technologies using low feature sizes are especially important for producing fine structures designed to vary at or near the granular level of the material involved.

In an exemplary embodiment, the loss in production volume as a result of the requirement to print high precision Interface Nodes can be compensated by reducing the size of the Interface Node. For example, nodes in transport structures may vary in sizes (as well as shapes), but they may generally have a range of dimensional scales that produce and receive desired ranges of forces, torques and other physical values given their function. In an embodiment, the size of the Interface Nodes is reduced to increase at least a part of the production volume lost by the slower print rate needed to render the high precision Interface Nodes. More specifically, in an embodiment involving the Interface Nodes, the amount of material used to make the Interface Node is reduced. The overall size and functionality at the actual interface of the Interface Node may be maintained, but the overall material consumption is reduced.

In an exemplary embodiment, the portion of the Interface Node that is required at the interface is printed at the required size and functionality, while portions of the Interface Node that are not needed for the interface may be reduced in mass. This way, the amount of material used to form the interface can be advantageously controlled, and the assembly/subassembly as a whole may have a smaller volume. This is possible by using additively manufactured Interface Nodes.

It will be appreciated by one skilled in the art upon reading this disclosure that, different applications may result in different ranges of factors like low-rate and high-rate printing, low and high production volume, low and high precision, and reduced size versus regular size Interface Nodes. While examples of these factors are included herein, it is submitted that one of skill in the art upon perusal of this disclosure will appreciate these ranges and the factors and variations involved in this ranges and factors based on, for example, standards used in the applicable industry, voltage, current and power requirements (where applicable), mass used in transport structures for protecting occupants, the relative properties and capabilities of different volumes of a material, and other factors.

The Interface Nodes may in some embodiments be light-weight, and the light-weight Interface Nodes may connect to the conventionally manufactured or other higher-throughput manufactured components. These latter components may include, for example, castings composed of metals or alloys, extrusions, machined components, and the like. In other aspects discussed further below, the Interface Nodes may be connected to the conventionally-manufactured components directly via material deposition.

More than one connection feature may be provided on the component to effect the connection. Also, a conventionally-manufactured component may be coupled to a node using more than one connection feature. This may be the case, for example, when the application requires a strong bond between the node and component, or when it is desirable to include more connection features to help prevent movement of the node or component for the application.

In one embodiment, the conventionally-manufactured component may be a metal or alloy casting. In another embodiment, the cast component can be composed of aluminum or a plastic. As described above, the casting may be heavy and voluminous, and can be made relatively geometrically simple to facilitate production times. The relatively simple nature of the cast part may be possible even where the attributes of the cast part for the applications at issue require use of complex regions of geometrical or structural complexity, use of multiple materials ("multi-material") having well-defined characteristics, reliance on specific thermal properties of the structure (e.g., melting points), complex and rigid tolerance requirements for the structure (e.g., allowed ranges of positions of substructures relative to one another), and regions requiring expensive tooling or significant changes in tooling (e.g., where changes/updates in the design are needed on a regular basis or model changes of a transport structure are frequent). These complex regions of the casting may instead be incorporated into the AM Interface Nodes designed to connect or integrate with the casting. Thus, these regions of the conventionally manufactured part, whether internal to the part or on its surface, may be incorporated into or replaced altogether with the Interface Nodes.

The light-weight Interface Nodes, in this embodiment, may adopt the complex regions and functions of the cast part in a straightforward manner using one or more suitable AM technologies. For example, where metallic materials are primarily needed to realize these structures, any number of PBF technologies (see FIGS. 2A-D, above) may be used to 3-D print the part. Alternatively, where plastic materials are required, a material extrusion AM system may be used, and so on.

As described above, one or more node-casting interfaces may be defined in which the cast components incorporate connection features. This is in addition to the Interface Nodes themselves, which may include connection features. While the number and type of connection features can vary depending on the application, the connection between the manufactured component and Interface Node(s) may be achieved using structures to support connections by welding, mechanical fastening, adhesive bonding, and numerous other mechanisms. The term "connection feature" is intended herein to broadly encompass physical or mechanical structures or substances for effecting a connection between components (e.g., between a vehicle node and a panel). Connection features may include anything from complex mechanical connectors to very simple connectors involving simple shapes integrated in a part, such as apertures, insets, projections, extensions, etc. In some exemplary embodiments, where the Interface Nodes are directly connected to the manufactured component with an adhesive, the adhesive and/or the surface(s) on which the adhesive is applied may be considered the connection features for both the Interface Node and the manufactured component. Where a Linking Node is used, the Interface Node may be connected to another structure using the Linking Node and where necessary, additional connection features.

In another embodiment, an Interface Node may include a tongue for interfacing with a (complementary) groove of another component. The tongue-groove connection may use a snap-in connection, it may be sealed with an adhesive, or it may use supplemental connectors or mechanical fixtures to further secure the connection. For the purposes of this disclosure, a connection feature is complementary if it is suitable for engagement with another connection feature on another component to form a connection. In some cases, connection features on the respective components may be identical and still be deemed complementary so long they are capable of engaging with each other to form a connection or to assist in forming the connection. In an embodiment, a connection between a node and another component may use two or more connection features. Where two structures, such as the cast component and Interface Node, have straight walls that are connected by a simple adhesive or welding, the adhesive or region of welding along with the interfacing walls may be deemed to constitute the connection features and complementary features. In an embodiment, the details that mandate the node-casting connection(s) may be constrained by the shape and other properties of the cast part.

The resulting structure may include a substructure—namely, the cast component (or in more general embodiments the conventionally manufactured component)—coupled via the connection features to an AM Interface Node. Advantage of using such a structure (namely, the cast component and the Interface Node) include, for the Interface Node, a substantially reduced consumption of AM powder material and, for the manufactured or cast component, a production of the components with faster lead times because the cast part may be maintained simple and in one embodiment, it may be maintained without significant changes over time. These factors may serve as key catalysts in implementing large scale production of transport structures and other mechanized assemblies with appreciable throughputs.

Casting constraints and requirements in these embodiments may be used as inputs for Interface Node design using computer aided modeling. The inputs may also enable specification of the connection features needed between the nodes and the cast component.

Figure 4:
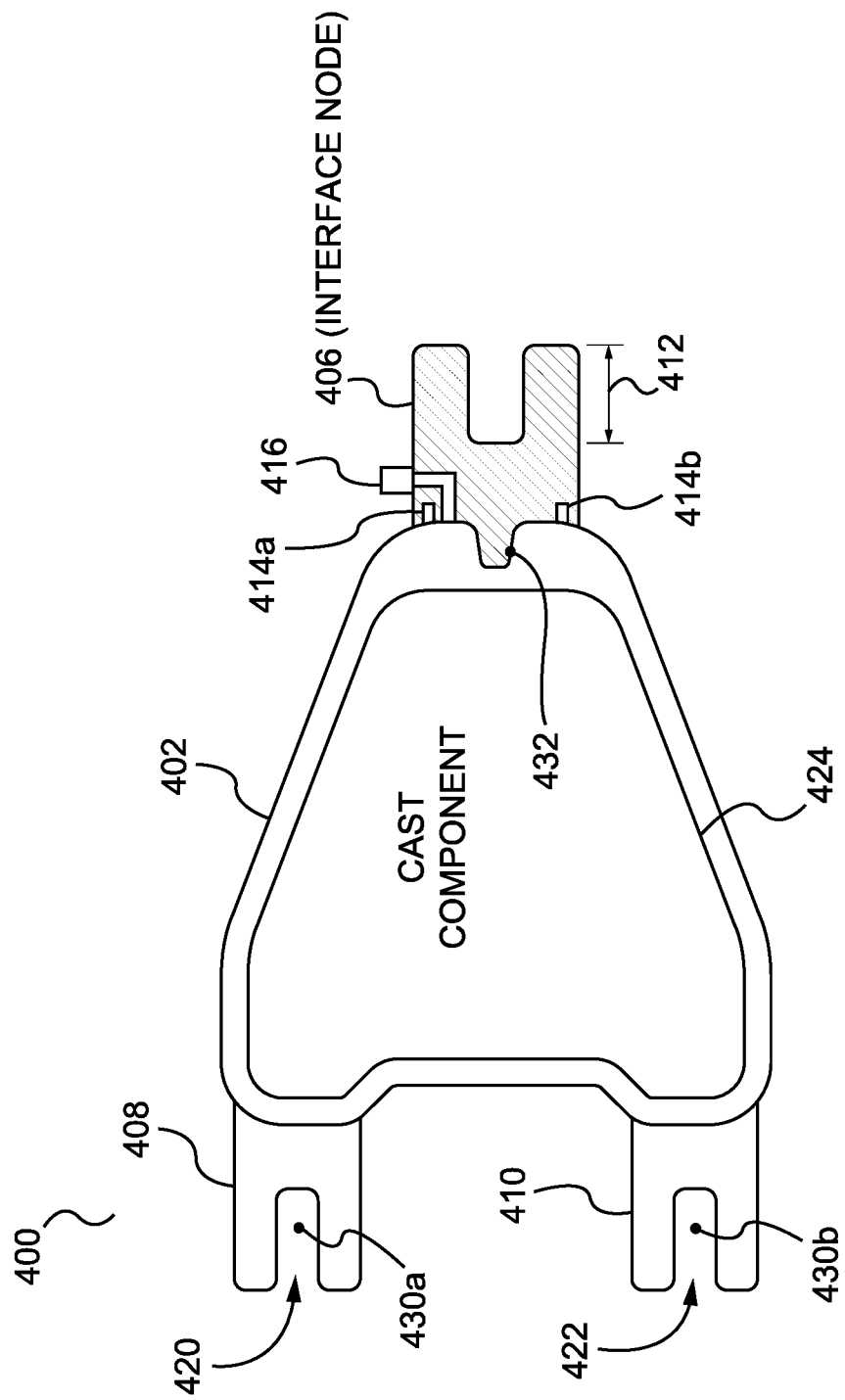
FIG. 4 is a side view of a structure including a conventionally manufactured component with connection features and an Interface Node with a complementary connection feature.

FIG. 4 is a side view of a structure 400 including a conventionally manufactured component 402 with connection features and an AM Interface Node 406 with a complementary connection feature. Component 402 is illustrated as a cast component, but in general component 402 may be machined or manufactured using another conventional technology amenable for relatively high throughput production. In other embodiments, component 402 may be manufactured using a generally higher throughput AM technique such as DED. In an exemplary embodiment, cast component 402 includes a voluminous chunk of cast aluminum or plastic, although other materials are also possible. Cast component 402 may be useful to provide a structure that incorporates a body of dense material, such as an impact structure in a vehicle. However, component 402 is not so limited, and other geometric configurations are possible. By way of example, cast component 402 may be made hollow and consequently may serve as a cover for another part, or a case for a more sophisticated structure (e.g., a gear case).

At the border region 424 of cast component 402 are connection features 408 and 410. In an exemplary embodiment, connection features 408 and 410 are part of cast component 402 and are cast or machined together with the rest of the component 402. In other embodiments, connection features 408 and 410 may be parts of other components, including, for example, Interface Nodes. In this former embodiment wherein the features 408 and 410 are included within the component 402, connection features 408 and 410 may be made of the same material (e.g., aluminum, plastic, etc.) and in this event they are subject to the same thermal constraints as that material. This fact may be taken into consideration in determining whether connection features 408 and 410 can be used in an environment containing significant amounts of thermal energy. In general, whether or not the connection features 408, 410 are part of the cast component 402, they may be connected to other components, including standard AM joints, other AM Interface Nodes, etc. Connection features 408 and 410 are negative features because they include respective grooves 430a and 430b. Thus, connection features 408 and 410 in this embodiment are configured to engage with complementary features that use positive connection features. These prospective engagements with connection features 408 and 410 are shown by respective arrows 420 and 422.

FIG. 4 also includes groove section 432 adjacent border region 424 of cast component 402. Thus, inset into cast component 402 is a negative connection feature for providing a connection to an AM Interface Node 406. Interface Node 406 is shown connected to cast component 402 using a positive complementary connection feature, i.e., the tongue that protrudes into groove 432. Generally, in this embodiment, node 406 may be composed of titanium (Ti) or iron (Fe), or some metal or alloy having different properties than the aluminum or plastic of cast component 402. The use of another chemical element such as titanium or iron may allow Interface Node 406 to have specifically defined thermal characteristics for use in particular applications. For example, the melting point of node 406 may be much higher, because the melting point of either titanium or iron is substantially higher than that of aluminum. This enables Interface Node 406 to maintain its structural integrity even if connected to regions of the transport structure or other machine with a high temperature. Furthermore, using a suitable AM technique, the thermal properties of node 406 can be carefully controlled. It is noteworthy that in many embodiments, FIG. 4 is not drawn to scale and cast component 402 may be significantly larger and more voluminous relative to node 406 than shown in the figure. (In other embodiments, the difference may be less significant or they may be comparable in size). Accordingly, rather than building an entire voluminous component 402 that includes these thermal requirements, the thermal characteristics are instead incorporated into a relatively small Interface Node 406. A substantial amount of powder may be saved in the process. In addition, titanium, which is expensive, need not be used unnecessarily in volume.

Interface Node 406 may be connected to cast component 402 via the tongue connection at groove 432 (as noted) together with the surface regions of component 402 adjacent groove 432 that contacts Interface Node 406. The negative connection feature including groove 432 may be engaged with the complementary, positive connection feature of Interface Node 406 via an appropriate adhesive. In this exemplary embodiment, precision fluid ports with fluid channels 416 (only one shown) may be built into Interface Node 406 to supply an adhesive and on an opposing side, to provide negative pressure in order to promote distribution and spread the adhesive. Interface Node 406 may also provide sealant grooves 414a and 414b or similar structures to provide a sealant to facilitate proper distribution of the adhesive. In addition, spacers or other structures (not shown) may be incorporated into the connection feature on the Interface Node 406 to prevent galvanic corrosion when certain dissimilar materials are involved. In another embodiment, channel 416 may instead be part of a network of cooling channels in Interface Node 406 for delivering fluid to and from the cast component 402 to carry thermal energy away. Additionally, Interface Node 406 may itself be composed of a material configured to dissipate thermal heat from cast component 402. In this case, Interface Node 406 may be made of a material with a significantly high melting point to accommodate the direct connection to cast component 402.

In the above example, Interface Node 406 removes complexities from the cast component 402. Interface Node 406 incorporates the complex thermal features that otherwise would be necessary for integration into at least a region of cast component 402. This saves manufacturers from having to make changes to the cast or to add the necessary complexity to whatever conventional technique is used, tasks which would otherwise increase lead times and lower throughput. Interface Node 406 also incorporates the complex fluid ports 416 and other potential structures in order to ensure a secure a proper seal to cast component 402, thereby reducing or eliminating the need for cast component 402 to embody these features.

Interface Node 406 also includes on the other end an additional negative connection feature 412, which may constitute any node-based connection. For example, connection feature 412 may be configured to connect the node 406 to any suitable structure. For example, node 406 may be connected to connecting tubes, panels, and other structures. In addition, the structure comprised of node 406 and component 402 may be one of two or more, or a network of, similar structures which may all be connected together through connection features similar to connection feature 412.

The Interface Node 406 illustrated in FIG. 4 may in other embodiments incorporate a multi-material complexity in that it may have been 3-D printed with different types of materials and potentially in different proportions to serve a specific purpose. In the embodiment shown, node 406 may incorporate a thermal complexity as in the case described above, where a higher melting point may be desirable to maintain the structural integrity of node 406 and protect that of component 402 from a heat source. However, it will be appreciated by those skilled in the art that in other embodiments, Interface Node 406 may incorporate other functions, structures, and features, as well as additional connection features (that may otherwise have had to be included in component 402) to enable node 406 to connect to a number of other standard interconnects. In this respect, Interface Node may incorporate a larger number of complexities in a manufactured component, rendering them unnecessary to place in the latter. This capability exploits the advantages of AM in a way that obviates a potentially significant amount of complex machining that may otherwise have to be performed in constructing these conventionally manufactured or higher throughput manufactured components. Further, in an exemplary embodiment, because use of the 3-D printer is not necessary for the conventionally manufactured components that incorporate the large volumes, but use of AM is only needed for the node itself, time and material may be saved in the AM process. A higher manufacturing throughput may consequently be obtained.

In addition, the connection feature 412 on the Interface Node and the connection feature defined by groove 432 on the cast component need not be a tongue and groove structure, and other connection features may be equally suitable. For example, the connection feature 412 may in an alternative embodiment include a pair of tube-like protrusions having an inner and an outer diameter, the smaller protrusion inside the larger protrusion, for enabling a connection to carbon fiber connecting tubes, thereby coupling the connecting tubes to the cast component 402 via Interface Node 406. More generally, on the end of the Interface Node where connection feature 412 currently resides, features may be incorporated to enable connection to any other component, including for example, extrusions, other nodes, other castings, etc. In an embodiment, a plurality of node-casting interfaces as described above may be used to form a chassis for a transport structure. In this embodiment, the type of component 402 may vary from region to region of the vehicle, and may not be used wherever not needed. In other embodiments, a single Interface Node may include a plurality of interfaces 412 for multiple connections.

Figure 5:
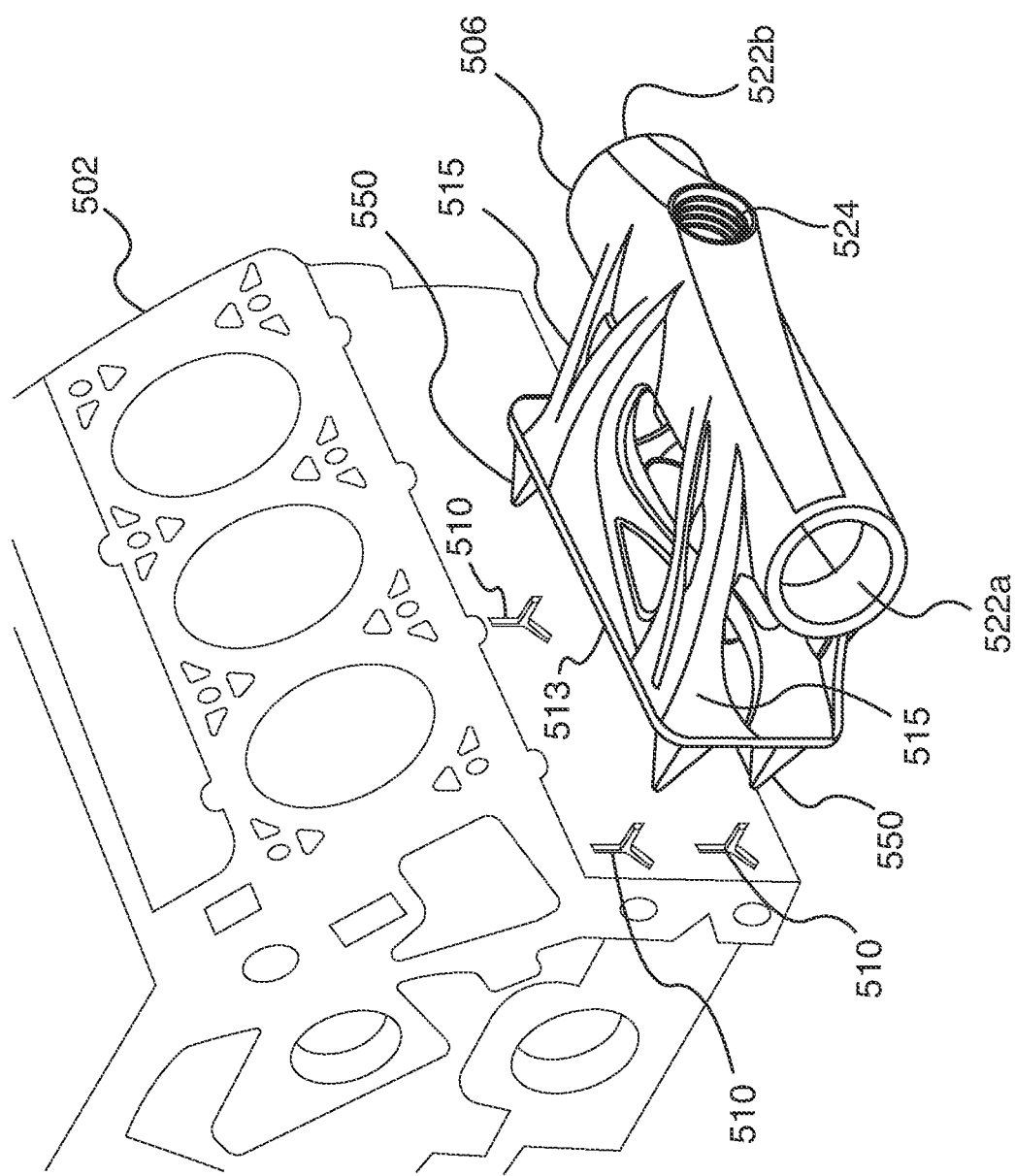
FIG. 5 is a perspective view of an Interface Node for coupling to an engine block using male connection features on the Interface Node.

FIG. 5 is a perspective view of an Interface Node 506 for coupling to an engine block 502 using male connection features 550 on the Interface Node 506. In this exemplary embodiment, the Interface Node 506 includes four male connection features 550 (three are viewable) in the form of sharp protruding members that may be respectively coupled to corresponding female connection features 510 on engine block 502. Engine block 502, in an embodiment, may be constructed using a cast mold and includes the shell to house the engine of the transport structure. In this embodiment, engine block 502 may generally be constructed using any non-3D printed method. Engine block 502 may in certain cases be manufactured in sections that are welded or otherwise connected together.

In turn, Interface Node 506 may be printed using one of the higher throughput PBF techniques, or generally any appropriate high precision AM technique whether or not identified in this disclosure. In this example, the size of the interface 513 is the same size that would normally be used for a transport structure with comparable engine and transmission parts, for example. That is, the interface 513 would not be reduced in size, unlike potentially other portions of Interface Node away from interface 513. Interface Node 506 also includes interfaces 522a-b and high-precision threaded interface 524, which may be connection features for connecting to other Interface Nodes, Linking Nodes, which in turn, may connect to other components (e.g., drivetrain, transmission, etc.). In appropriate embodiments, Linking Nodes may be used.

In an embodiment, the Interface Node 506 includes a network of reinforcing structures 515 used to securely affix the interface 513 to the remaining connection features 522a-b, 524. The network of reinforcing structures 515 and connection features 522a-b and 524 may in some embodiments be substantially reduced in size to accommodate a high volume production with respect to the manufacture of Interface Nodes 506. The geometry of the network of reinforcing structures 515 would be determined by topology optimization, and these geometries would leverage the capabilities of additive manufacturing to fabricate complex structures which would otherwise be difficult or impossible to fabricate using conventional manufacturing processes. In this example, other Interface Nodes or structures that may connect to Interface Node 506 via one or more of the connection features 522a-b and 524 may also be reduced accordingly. In an embodiment, reductions may be made in any area of the Interface Node outside of the interface that do not physically affect the function of the components in a negative way.

In some configurations, it may be desirable to provide isolation between the conventionally manufactured component and the Interface Node in the event that the materials are dissimilar. Isolation may assist in preventing galvanic corrosion that may otherwise occur due to the difference in the electrode potentials of the materials used for each structure. Accordingly, an exemplary embodiment may include a structure for achieving the required spacing.

Figure 6A:
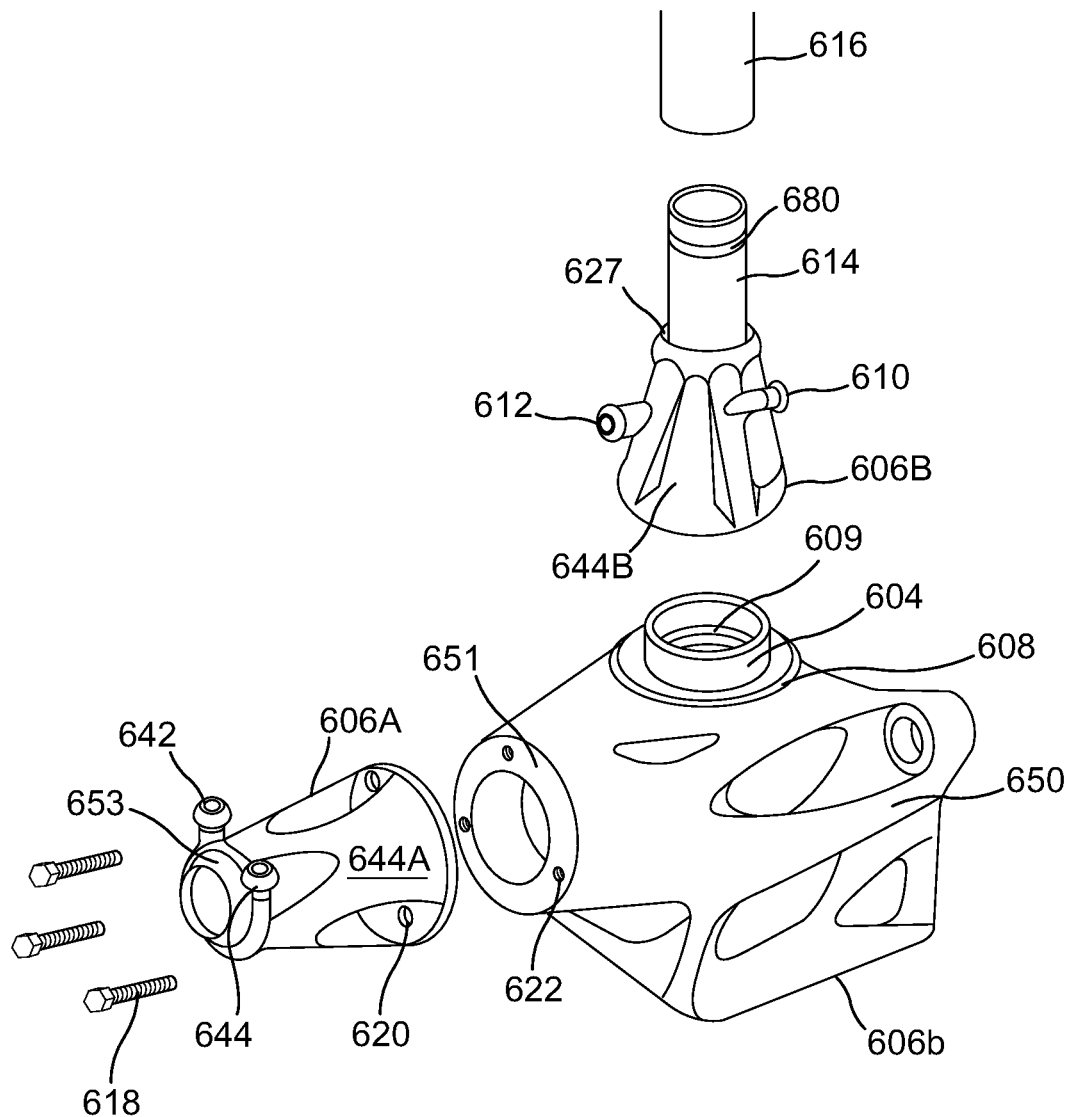
FIG. 6A is a perspective view of a Linking Node configured to be coupled to two Interface Nodes, the Interface Nodes being assembled for coupling to respective spanning components as a foundation for forming a structure such as a chassis.

FIG. 6A is a perspective view of a Linking Node 613 arranged for connecting to two Interface Nodes 606A and 606B, the Interface Nodes 606A-B being further arranged for coupling to respective spanning components 616 (only one shown in FIG. 6A) as a foundation for forming a larger integrated structure such as a chassis. As shown below, in this embodiment, Interface Node 606A has connection features, including three apertures 620 and bolts 618, and a suitably sized and shaped flat surface at its base that is substantially parallel to flat surface 651 of Linking Node 13. The bolts 618 and apertures 620 of Interface Node A are configured to bolt with corresponding apertures 622 embedded into a surface 651 of Linking Node 613. Accordingly, Interface Node 606A in this embodiment is securely bolted to Linking Node 613. At the opposite side of Interface Node 606A distal from the aperture 620 portion, connection features including adhesive inlet port 642 and a vacuum port 644 are disposed along with an additional circular-shaped connection feature 653 designed to interface and couple with a spanning component (not shown) such as a carbon fiber reinforced polymer (CFRP) connecting tube.

In contrast to bolting, Interface Node 606B is configured to be bonded with Linking Node 613 via a double-shear (node-node) connection. More specifically, Interface Node includes at its base an area (FIG. 6B) into which a protrusion from Linking Node 613 can be inserted. Linking Node 613 includes a protrusion in the form of a flange 604. Flange 604 may be combined with O-rings 608 and 609 (or other sealants) to enable a strong connection to the more sophisticated connection features of Interface Node 606B (see FIG. 6B). At the other end of Interface Node 606B distal from the interface with Linking Node 613, Interface Node 606B further includes an internal portion 627 which may include a base for a circular protrusion 614 extending out of Interface Node 606B. The internal portion 627 and circular protrusion, in concert with adhesive inlet port 612 and vacuum port 610, enable Interface Node 606B to form a solid adhesive bond with spanning component 616 (see also FIG. 6B).

Interface Nodes 606A-B respectively include contours 644A-B that are well streamlined to receive and support spanning components such as tube 616, while demarcating a physical size for the Interface Nodes 606A-B that is not larger than necessary. Thus, these Interface Nodes 606A-B are designed to be compact and feature rich, and only of a size that is necessary to accommodate the functions performed by their high precision features, as further shown in FIG. 6B (discussed below). In an embodiment, spanning component 616 is a carbon fiber reinforced polymer (CFRP) connecting tube configured to form a link with Interface Node 606B using a sealant and an adhesive. Generally, adhesive inlet and vacuum ports 612, 610 enable the flow of adhesive within Interface Node 606B to (i) secure spanning component 616 to the Interface Node 606B and (ii) secure Interface Node 606B to Linking Node 313. Thus, ports 612 and 610 constitute connection features for both interfaces at opposing ends of Interface Node 606B. Being connected to Linking Node 613 albeit using different methods, Interface Nodes 606A-B in turn are connected to each other via the Linking Node 613 and also to any other components that may be connected to any of the structures.

Linking Node 613 may include elongated sections 650 of a reinforcing metal material, and other shapes that may be designed to enable a strong bond and a proper load transfer across the body of connected elements. Linking Node 613 may be produced by a fast, albeit generally lower precision, AM process such as DED. As a result, different metals may be used in the manufacturing process such that Linking Node 613 can inherently include load-bearing strength and also, due to its material strength, may be a reliable connector of the Interface Nodes 660A-B.

Figure 6B:
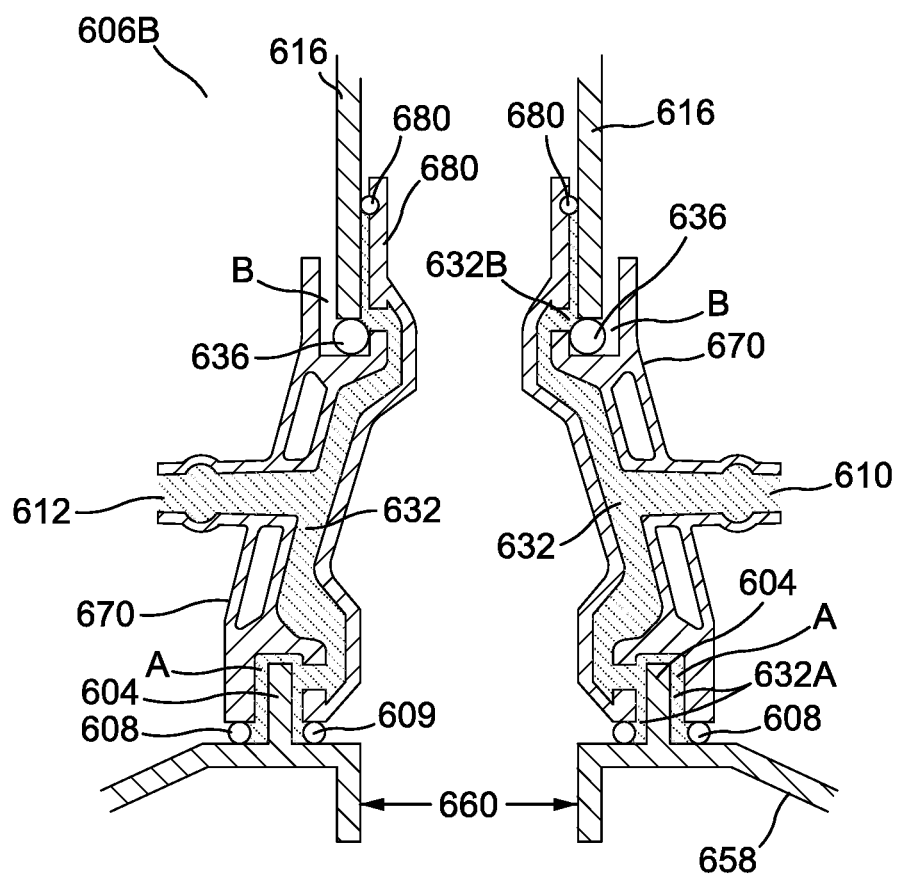
FIG. 6B is a front, cross-sectional view of the upper Interface Node of FIG. 6A showing the respective connections to the spanning component and the Linking Node.

FIG. 6B is a front, cross-sectional view of the upper Interface Node 606B of FIG. 6A showing the respective connections to the spanning component and the Linking Node. Initially FIG. 6B, being a cross-sectional view in which the interior of the Interface Node is shown, it becomes evident that the sophisticated, high precision features, including the connection features, have become compactified into Interface Node 606B, rather than the substantially lower precision feature (e.g. The flange 604) of Linking Node 613.

Referring to FIG. 6B starting at the bottom of the Figure, a cross-sectional view of the surface of 658 is illustrated. An inner diameter 660 is provided. This inner diameter 660 may be used in other embodiments for routing of wiring or other material from connecting tube 616 through Interface Node 606B and into Linking Node 613. Referring back to the present embodiment, the sides of circular flange/tongue 604 are also viewable protruding up into the connected upper node 606B. The flange/tongue 604 may be machined after the Linking Node is manufactured through a separate post-processing operation. Notably, the connection features of Linking Node 613 are very simple, as again, the higher precision features may be found in the Interface Node 606B. Additionally, the two circular O-rings (shown as circles in this cross-sectional view) can be seen between the flange protrusions. An inner body 614 of the node 606B can also be seen in cross-sectional view; the body 614 is in actuality partially cylindrical in nature, with variations. The outer structure 670 generally surrounds the node 606B and its geometrical complexities arise in part from the function of reinforcing and supporting the inlet and vacuum ports 612 and 610, and providing a strong, load bearing As noted, the adhesive inlet port 610 and vacuum port 612 are easily seen in this view. An important aspect of this view is the texture 632 defining the filling between structures 614 and the interior of 670 adhesive that was circularly distributed throughout the interior by the action of the adhesive inlet and the vacuum. The adhesive 632 is shown flowing to the bottom of the surface. For example, 632a defines regions where the adhesive has saturated both sides of the circular flange and is sealed from further migration by O-rings 608 and 609. In this way, the adhesive forms a very strong bond between the flange 604 of the Interface Node 606B and an interior portion A of node 606B configured to fit, with room to spare for adhesive, around the flange 604.

At the top of FIG. 6A, the spanning component 616 is viewable, which in this embodiment is a carbon tube. The carbon tube inserts over the inner protrusion 614 onto circular sealant or O-ring 636 at the base of an inset B of the node 606B into which the carbon tube 616 is inserted. An additional sealant or O-ring 680 may be disposed around an upper portion of the inner protrusion. O-rings 636 and 680 act to prevent the migration of the fluid adhesive out of inset B and therefore out of node 606B, or into the interior of carbon tube 616. However, the interior region between tube 616 and tube 614 has large surface areas filled with adhesive. Upon curing, the result is a strong bond between protrusion 614 and tube 616.

As is noteworthy in the embodiment of FIGS. 6A and 6B, the connection features of the upper and lower interfaces of the Interface Node 606B, such as the insets A and B, complex reinforced adhesive inlet and vacuum ports 612 and 610, and the complex, surface-area increasing shape of the interior walls of Interface Node 606B, the inner protrusion and sealants, demonstrate both the sophisticated and streamlined functional nature of the Interface Node and the geometrical complexity idealized for, among other things, the correct flow of adhesive, are substantially distinguishable from the more straightforward functions and features of the Linking Node 613. These features advantageously allow the Interface Nodes to realize multi-material architectures. Further, the Interface Node 606B in this embodiment is far more compact than the Linking Node while maintaining the necessary sizes at the interfaces. Accordingly, Interface Node 606B and similar node 606A are likely ideal candidates for design independent production using a high precision powder bed fusion technique. Linking Node 613, which includes some lower precision features and functions, may be machined or cast, or alternatively may be produced using a high speed, lower precision AM technique such as DED.

While two Interface Nodes are shown for the purposes of this example, more than two nodes or other ports may be used in other embodiments.

Figure 6C:
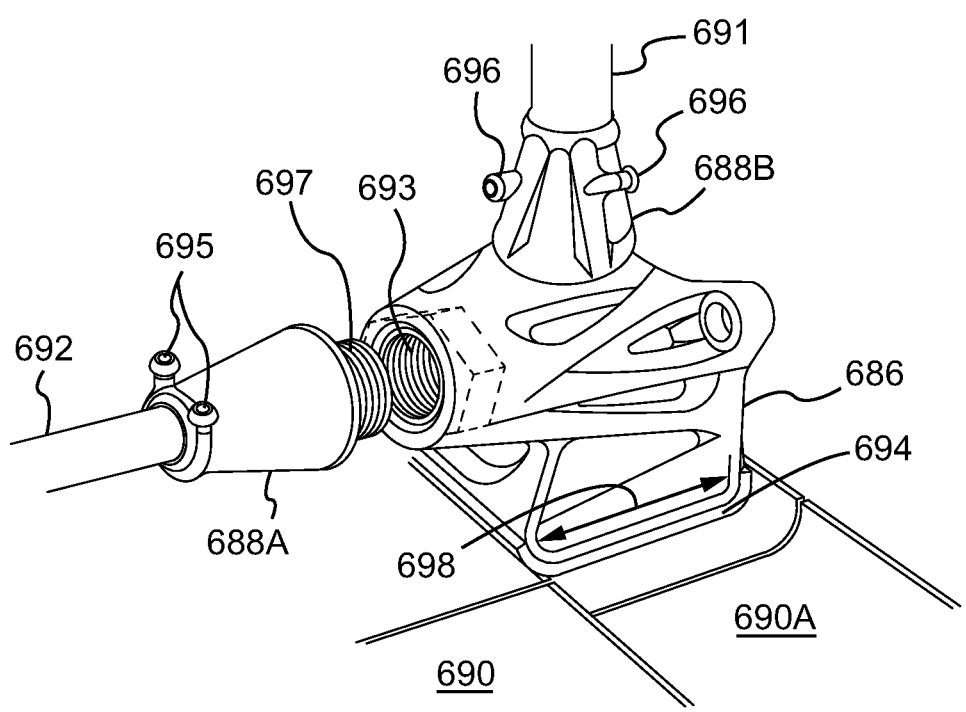
FIG. 6C is a perspective view of a Linking Node coupled to carbon fiber tubes via Interface Nodes and coupled to a high-throughput manufactured component using an isolation feature.

FIG. 6C is a perspective view of a Linking Node coupled to carbon fiber tubes via Interface Nodes and coupled to a high-throughput manufactured component using an isolation feature. In this exemplary embodiment, Linking Node 686 has three connections. Two are to Interface Nodes 688A-B, and the remaining one is to cast component 690. Carbon fiber tube 692 is a spanning component that may couple at one end to another structure, such as another Interface Node (not shown). Tube 692 is connected to an AM Interface Node 688A via an adhesive-bond connection facilitated by adhesive inlet and vacuum ports 695 in a manner discussed with respect to FIG. 6B.

Interface Node 688A further includes 3-D printed connection features 697 which in this exemplary embodiment includes a cylindrical protrusion with high precision threads for connecting to Linking Node 686. Because Linking Nodes may include lower precision features but are typically enable of including high precision features such as very fine threads for mating with connection feature 697, a "captive nut" 693 is shown embedded in the Linking Node 686. The nut 693 may be a 3-D printed or a standard off the shelf part. In an embodiment, the Linking Node 686 is 3-D printed with the captive nut 693 placed inside. Proper supports are printed around the captive nut 693 while the linking nut 686 is printing. The connection features 697 of Interface Node 688A can thereupon be inserted into the captive nut 693 and thus the Interface Node 688A can be tightly bonded together with Linking Node 686. In another embodiment, captive nut may be co-printed with the Linking Node for a suitable printer.

FIG. 6C further shows Interface Node 688B which is similar to the Interface Node 608B in the prior illustrations. Using adhesive inlet and vacuum ports, Interface Node 688B can be bonded via a strong cured adhesive bond with carbon fiber tube 691 on the upper side, and with the provided connection features (obscured from view) of the Linking Node 686 on the lower side. In an embodiment, the connection is a double-shear adhesive connection with the sophisticated connection features embedded in the Interface Node 688B, as shown in previous embodiments. In other embodiments, the connection may be a bolted connection. Numerous other types of features may be contemplated to accomplish bonding between the Interface and Linking Nodes. In one embodiment, the respective Interface and Linking Nodes may include connection features that can be welded together. In the embodiment shown, carbon fiber tubes 691 and 692 are oriented a substantially orthogonal direction relative to each other.

Additionally, FIG. 6C shows that Linking Node 686 is bonded to a cast component 690, which in an embodiment may be an interior or exterior panel. Component 690 may be very large, and may also include basic structural functions and features. For instance, component 690 includes an inset portion 690A which may include a connection feature for component 690. Linking Node 686 may be bonded to component 690. Alternatively, Linking Node 686 may be welded or bolted to component 690. In other embodiments, Linking Node 686 may be coupled to additional Interface Nodes that are used to create the connection to component 690. In this illustration, the geometry of Linking Node 686 is such that its lower portion 698 spans substantially across an area defined by inset 690A. In an embodiment, an isolation member 694 is arranged between the interface defined by Linking Node 686 and cast component 690. The purpose of the isolation member 694 is to avoid direct contact and prevent galvanic corrosion of the materials in the event Linking Node 686 and cast component 690 are composed of dissimilar metals. An adhesive may be applied between sections of isolation member 694, or in other embodiments, on its respective surfaces to enable a strong bond between Linking Node 686 and cast component 602. In other embodiments, the bond may be realized instead by using one of a variety of connection features. In still other embodiments, one or more of the Interface Nodes may be coupled directly to the cast component.

In another embodiment, prior to the application and curing of the adhesive, the isolation feature 695 may be inserted between the node Linking Node 686 and the component 690 to provide a space between the Linking Node 686 and cast component 690 such that physical contact between the two parts is avoided, thereby avoiding subsequent problems with galvanic corrosion if the metals are dissimilar. In addition, in some embodiments, sealants and other features such as standoffs for fixturing may be incorporated into Linking Node 686 and/or component 690 for use in the spacing and isolating procedures. All of these steps may advantageously aid in the prevention of galvanic corrosion where different materials having different respective electrode potentials are used in the substructure (node and component) of the structure.

In some embodiments, an Interface Node may be 3-D printed using a unique asymmetrical shape rendered by the 3-D printer to accommodate a specific space inside a transport structure or other mechanical device.

In an embodiment as noted above, the techniques in FIG. 6A-C may involve the use of material in the chassis of a vehicle. DED-produced Linking Nodes may be implemented in any location where the topology optimization process determines that a material for linking components is desired in a section of the vehicle. The program's determination and the ensuing manufacturing process can be broken down using a variety of parts as described above. Namely, the larger, low complexity structures can be manufactured using a faster AM method such as DED or a non-3D printed method, while the more complex structures may be manufactured at a reduced size using a high precision AM process. Together with the necessary connection features, this latter procedure can produce Interface Nodes. As described above in the figures and embodiments above, producing the compact Interface Nodes, streamlined in an embodiment without extraneous bulky material, may allow for efficient material consumption while fabricating the high precision Interface Nodes, which may in turn lead to shorter print times. To the extent high strength, lightweight structures are needed in the area of the design, multi-material architectures may also be used. For example, Linking Nodes using different metals may be printed using DED. By selectively using Linking Nodes with Interface Nodes, these multi-material connections can be realized and implemented in the vehicle. As discussed above in FIGS. 6A-C, the Interface Nodes, which may be connected to Linking Nodes, may also be connected to spanning components like carbon-fiber tubes to form a lightweight chassis, with the required mechanical performance (stiffness, torsional rigidity, crash optimization, etc.). Load paths and their characteristics can also be tailored by using this approach.

These procedures are in contrast to conventional reliance solely on traditional manufacturing techniques which are more often than not characterized by significant tooling and machining costs, and needless additional lead time. Moreover, the use of conventional procedures would in many cases render it impossible to fabricate a chassis which most closely matches the ideal structure for optimal load path distribution. Conversely, the Interface and Linking Nodes benefit from the non-design specific feature of additive manufacturing by enabling the precise realization of the load paths and related chassis features.

As another exemplary application, transport structures utilize crash components manufactured using traditional processes (stamping, extrusions, etc.). In lieu of these conventional procedure, the Interface Node-based infrastructure can be used to implement complex connection-based geometries that correspond to an optimal load path. Rather than investing significant time and money in machining these components to correspond to the desired optimized topology, the components can instead be procured using relatively simple geometries through any high-volume conventional means or high volume printing means. The components can thereupon be connected via Interface Nodes for implementing the most suitable and optimal load path to address crash performance.

The principles and techniques herein further provide a manufacturer with capability to produce simple parts using conventional processes and nodes incorporating part complexity using AM processes. In the example of cast parts as described above, casting is a tooling intensive manufacturing process. Additionally, as described above, it is difficult to fabricate cast parts with complex features such as mechanical reinforcements, cooling channels and the like. Using AM Interface Nodes, complex features can be developed on or within the node instead, which enables the designer to preserve relative simplicity of the conventionally manufactured feature.

In another embodiment, AM Interface Nodes can be used to augment mechanical reinforcement in regions bearing high loads. Accordingly, if the cast part and Interface Node are designated to be placed in a region which may be subject to significant gravitational loading and other forces, the Interface Nodes may be rendered to provide additional support to counteract this loading in addition to the cast part.

Figure 7A:
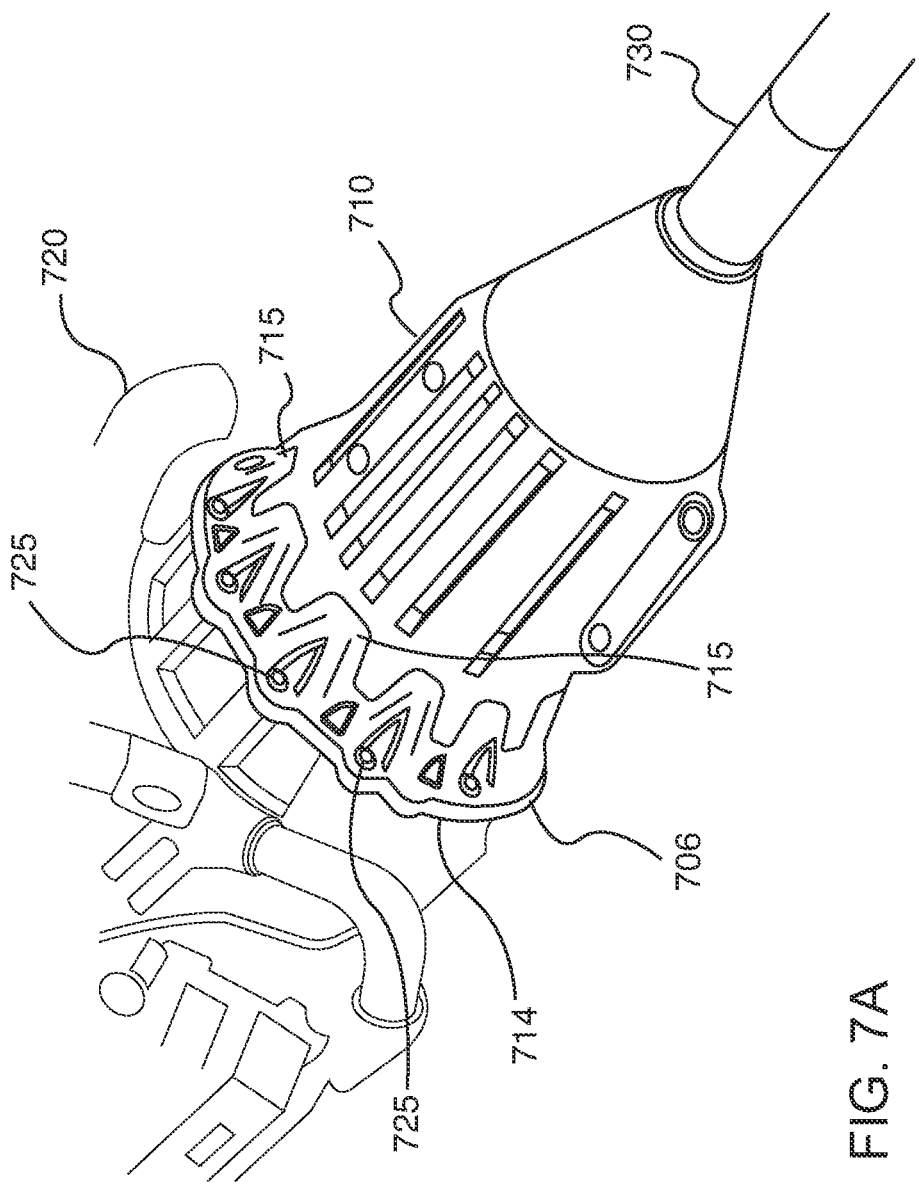
FIG. 7A is a perspective view of a cast bell housing coupled to an Interface Node configured to dissipate thermal energy from the engine block.

FIG. 7A is a perspective view of a cast bell housing 710 coupled to an Interface Node 706 in the context of an output drive shaft. Interface Node 706, which surrounds a periphery of the interface of housing 710, may be configured to dissipate thermal energy from the engine block 720. In FIG. 7A, a large section of the bell housing 710 may be manufactured using conventional processes such as casting. In an embodiment, the material comprising cast component 710 is aluminum, although other materials are possible.

In the example of FIG. 7A cast bell housing 710 functions as a component in that it is a housing (that is, a gear box case), but it also includes load carrying capability in linking to and transmitting a load to another component at the other end of shaft 730. As a result, cast bell housing 710 can be considered to be both a component and a Linking Node.

The AM Interface Node 706 may connect over an open end of the bell housing 710. The Interface Node 706 surrounds the end of the bell housing 710 and covers the end portion with fingerlike members 715. The Interface Node 706 includes a standard size interface 714 for connecting to engine block 720 a plurality of threaded bolts 725, at least in part, for connection features to the bell housing 710 and engine block 720. In this embodiment, the bolts extend into visible channels that surround the engine block 720 interface. In other embodiments, the Interface Node 706 may be coupled to component 720 via, for example, a tongue and groove connection, bonding, welding, or other suitable connection feature.

In an embodiment, the AM Interface Node 706 is 3-D printed with a material such as titanium, steel, or another material or alloy having a significantly higher melting point than the aluminum cast component bell housing 710. For example, the melting point of pure aluminum is about 660° Celsius. The melting point of steel falls in at a range of about 1425°-1540° Celsius (depending on factors like its carbon content), and the melting point of titanium is about 1670° Celsius. The respective melting points of these materials are at least twice that of aluminum.

Having the Interface Node 706 fabricated from a material with a higher melting point than the component 710 may enable the assembly (or subassembly) of the Interface Node 706 and component 710 to function properly in a region that includes a significant heat source, such as an engine block 720. Interface Node 706 may also be fabricated with features designed to dissipate the heat. For example, Interface Node 706 may be constructed with complex networks of cooling channels. In this embodiment, the fingerlike members 715 that extend from and surround the perimeter of the end of bell housing 710 may assist in transferring heat from node body 706 accumulated as a result of the connection to a heat source (engine block 720) and to dissipate the heat. The temperature gradient may be made more manageable due to the members 715 as the increased surface area provides improved heat transfer characteristics in comparison to flush contact by the node 706 with the heat source without members 715.

In other implementations, Interface Node 706 may incorporate other sophisticated features to support processes such as welding, mechanical fastening, adhesive bonding, and the like, to secure a connection both to the Interface Node 706 and to an engine block 720 interface or other channel to which it will be ultimately affixed.

Figure 7B:
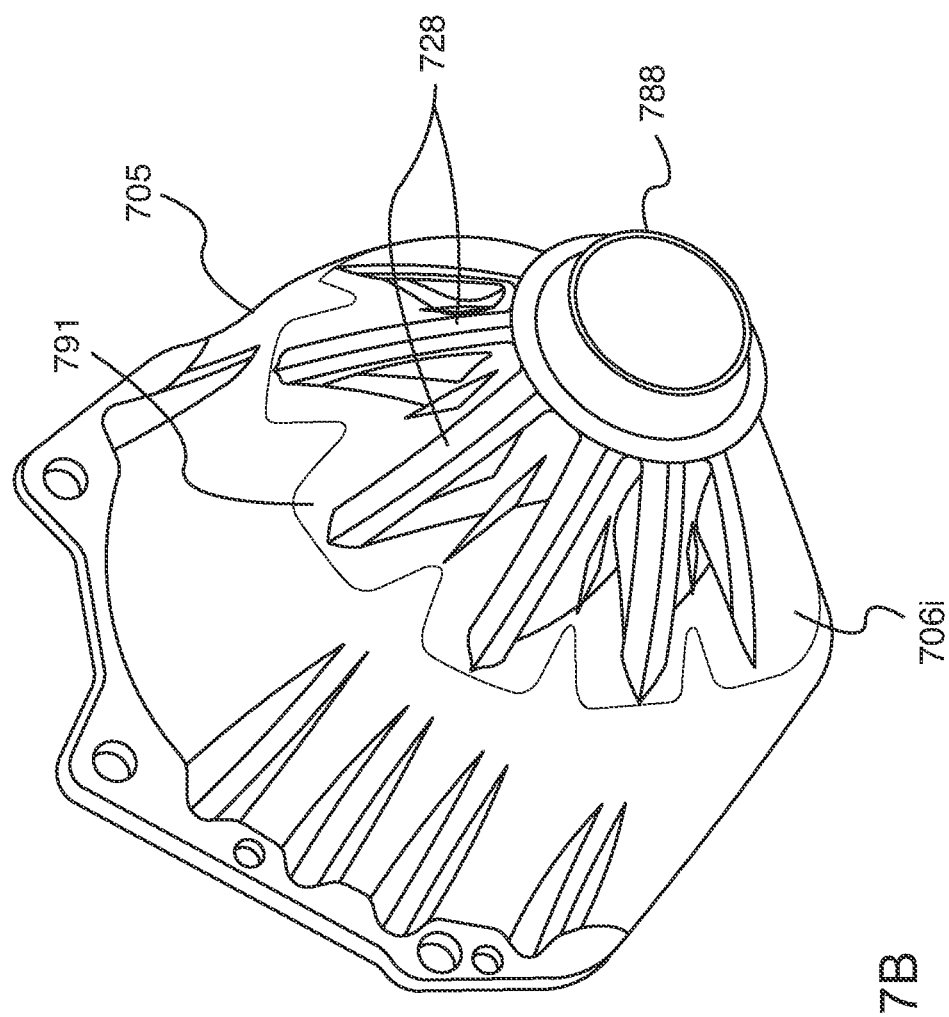
FIG. 7B is a perspective view of an Interface Node coupled to an end of a cast transmission case.

FIG. 7B is a perspective view of an Interface Node 706i coupled to an end of a cast transmission case 705. Interface Node 706i includes a plurality of reinforcing structures 728 extending peripherally around the end of the transmission case, a connection feature 788 such as a flange or an internally threaded member for enabling connection via a rod to a drive shaft of other component. The reinforcing structures of Interface Node 706i may assist in providing a strong connection between the transmission case 705 and the connection feature 788. The Interface Node 706i further includes fingerlike portions 791. Portions 791 may be used to provide additional surface area for securing the connection of Interface Node to transmission case 705. Alternatively, the Interface Node 706i may be connected to the cast transmission case 705 by means of an adhesive, using adhesive and vacuum ports and channels (not shown) built into the Interface Node. Fingerlike members 791, as noted, may operate to provide a stronger bond to the transmission case 705 and to dissipate thermal energy. In other embodiments, Interface Node 706i may include additional features. In an embodiment, the reinforcing structure 728 has been substantially reduced in size while the interface with the transmission case 705 remains substantially the same size.

In an exemplary embodiment, complex or high precision features that are traditionally used on or associated with the component may be instead incorporated into the Interface Nodes. These high precision features may include geometrical and structural complexities such as various connection features for coupling the components with the Interface Nodes.

More generally, these high precision features may include, by way of example, intricate shapes, substructures, or patterns disposed on or integrated within a part, multiple regions of curvature or other complex shapes designed to perform one or more functions, singly or in concert with other elements. Examples include structures traditionally used with machines, motors, or other mechanized equipment and mechanized assemblies; specialized parts such as features in custom panels; materials or combinations of materials organized into specific shapes to perform predetermined functions; repetitive patterns such as networks of links, rods, rails, fingers, or other intentionally designed arrays of substructures; small or microscopic structures and features integrated onto or within the part; and finely tuned materials organized in a coherent or meaningful way to perform a designated function. Geometrically complex features may also include structural updates, upgrades, enhancements, or features that require changes from part to part and include, for example, features or substructures whose design or shape changes from part to part. Such features or structures may present throughput difficulties in a casting or molding application because, for example, different sets of tooling shells may be required to provide the needed changes on each part. Structurally high precision features may also include electronic circuits and elements such as inductors, coils, and capacitors. Such features may also encompass integrated circuits, processors, electronic devices, physical input features (such as one or more switches), user interfaces, displays, and the like.

These high precision features may further include mounted fixtures, specialized flanges, vertically and horizontally threaded mounting plates, floating nuts, clamps, screws, and other fixtures that include extra detail or especially fine geometries that may be distributed across the structure and that by design may require careful positioning. While components and Linking Nodes may include flanges, plates, screws and other features, generally the Interface Node provides such structures with greater sophistication, smaller sizes, specialized or custom substructures, and unique, design dependent features. In addition, the Interface Node may provide the above structures in a compact way with tight 3-D spatial margins, such as the Interface Node in FIGS. 6A-B.

High precision features may also include substructures whose geometries accommodate or enable intended rotating or translating motion either integrated within the structure or provided externally, or both. Common features may be high precision, as is generally evident to one skilled in the art, in situations where they require precision placement or where they are integrated into a more complex array of additional types of structures. For example, high precision features may demand strict tolerance requirements, such as involving parts that must be oriented relative to one another with precisely defined angles or distances. Parts may also need to be positioned relative to one another at precise ranges or distances in order to function properly. These parts may need to be manufactured using separate machining techniques or precision AM technologies.

Commonly, features may be high precision in cases where a part containing the feature cannot practically be manufactured with an acceptably high throughput (relative to the application) using the same manufacturing process used to produce the remainder of the part. For example, while a vehicle gear case may be fabricated using a traditional casting technique, internal channels for providing adhesive or negative pressure to specifically defined regions of the cast part may have to be separately constructed using another method in order to achieve the desired throughput for the finished gear case.

Examples of high-precision features may also include structures having specific material requirements. For example, certain regions of the structure may be composed of a specific type of material or combination of different materials. Different regions of the structure may require use of different materials depending on the geometry of the structure, the load characteristics of the structure and adjacent structures, and other considerations pertinent to the application for which the structure is being used.

High precision features involving material properties that may compromise throughput may include one or more of rigidity, elasticity, ductility, malleability, hardness, thermal tolerance, resistance to corrosion or contaminants, mass, physical stability, or chemical reactivity or resistance thereto. The level of precision of various features may also include the extent and manner in which the features require specific thermal characteristics, including different melting points, thermal control over phase changes, required heat capacities, etc.

Interface Nodes and AM components. In another aspect of disclosure, AM interfaces nodes may be coupled to components produced using higher throughput additive manufacturing techniques. For example, these high throughput techniques may include DED. As described at length above, DED deposits materials via a powder depositor or a wire feedstock and directs energy from an energy source such as an electric arc, laser or electron beam to melt and solidify the material. These steps are repeatedly performed using a layer-by-layer deposition process, until the desired build piece is formed. Currently, a variety of available DED processes have measurably higher throughputs in comparison to other AM processes including PBF.

In this aspect of the disclosure, DED may be used in conjunction with a mainstream AM process, e.g., PBF, to produce a structure with a higher net throughput than using the mainstream AM process alone. Like in previous embodiments involving casting and other conventional manufacturing techniques, similar advantages may be obtained due to the ability to incorporate the complex features from the component into the AM Interface Node. Furthermore, as in prior embodiments, the AM Interface Node may in general not be highly voluminous. Instead, the Interface Node may be sized appropriately to only incorporate the necessary structure and features.

Interface Nodes may be manufactured using PBF or other AM processes that result in parts having small feature size and accurate prints. While AM can flexibly and accurately print Interface Nodes having complex features, AM and its attendant advantages may be significantly enhanced by using DED to deposit material onto the Interface Node. In particular, a higher production capacity for the resulting structure may be achieved. In the embodiments to follow, structures are proposed for interfacing with the Interface Nodes, similar to previous techniques. These Interface Nodes can also use suitable connection features to connect to other structures (tubes, panels, extrusions, other nodes, and the like), e.g., using another region of the node.

Figure 8:
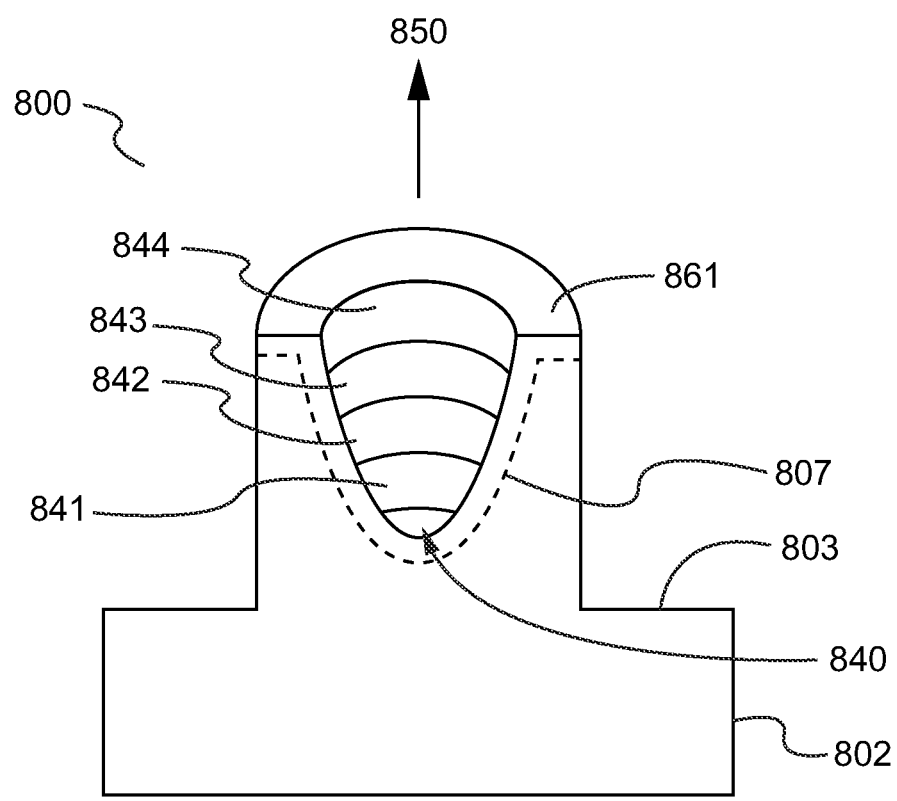
FIG. 8 is a front cross-sectional view of an Interface Node undergoing welding-based deposition using Directed Energy Deposition (DED).

Weld pool management: In an embodiment, complex features for weld pool management may be integrated into the Interface Node. A weld pool generally refers to a localized volume of molten metal in a weld prior to its solidification into weld metal. FIG. 8 is a front cross-sectional view of an Interface Node 800 undergoing welding-based deposition using Directed Energy Deposition (DED). The top surface adjacent arrow 850 is the cross-section. The DED build is proceeding vertically in the figure, as material is deposited layer-by-layer as shown by the DED build direction arrow 850. Interface Node 800 includes a base 802 having a flat upper surface 803. Generally, the larger the weld pool, the greater the residual stresses that result due to the rapid cooling and solidification of the weld. The first layer 840 of the welding based deposition process may be performed on a feature of the Interface Node 800 that may control the weld pool to ensure that the weld stresses are manageable. In an embodiment, the feature includes a cavity in which the first layer 840 may be deposited. Subsequent layers 841-844 may then be deposited over the first layer 840.

FIG. 8 shows that the Interface Node includes a nominal region 807 which specifies within some margin where the Interface Node is to be joined with the high throughput component 861 formed by the DED process. The high-throughput component 861 is generally larger than the Interface Node 800, but component 861 is illustrated at cross-section for clarity such that any size difference would not be apparent from the figure. The initial layer 840 defines the region where the DED-based component 861 is joined to the Interface Node 802. It is generally important to control the residual stresses arising from the potentially large temperature gradients at that region.

In an exemplary embodiment, a machining operation may be performed over the first layer 840 or the first few layers 840-844 to help ensure a smoother, flat surface. In this respect, the Interface Node 802 effectively serves as a "build plate" for the larger, high throughput component 861. The Interface Node 802 may be 3-D printed with a dimension greater than the nominal dimension 807 at the feature sections to account for melting during the deposition process 850. One important design consideration is the melting temperature of the Interface Node 802. The temperature should be high enough to allow the surface 803 to function as a substrate or build plate for the deposition process. Various materials or alloys may be chosen for Interface Node 802 that have the requisite thermal characteristics.

Figure 9A:
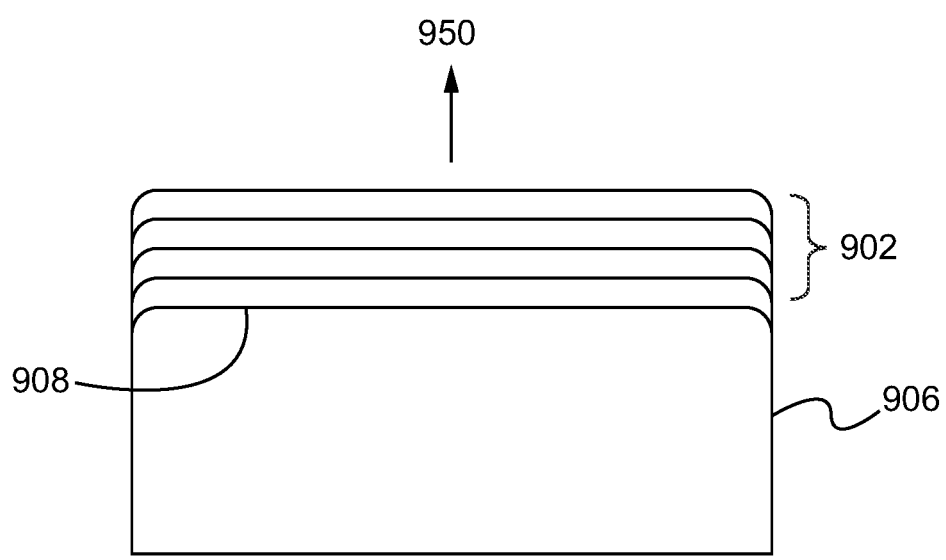
FIG. 9A is a front view of an AM Interface Node having a flat upper region for DED deposition.

Direct weld: In another embodiment, Interface Nodes may be printed having features that are substantially flat. These features may essentially serve as build plates for DED technologies that require a flat surface for material deposition. FIG. 9A is a front view of an AM Interface Node 906 having a flat upper region 908 for DED deposition. The material from the wire feed of the energy source deposits material layer-by-layer in region 902 beginning at upper region 908, which is effectively the substrate for the build piece 902. As in previous embodiments, the direction of the build 950 proceeds vertically in the upward direction.

Figure 9B:
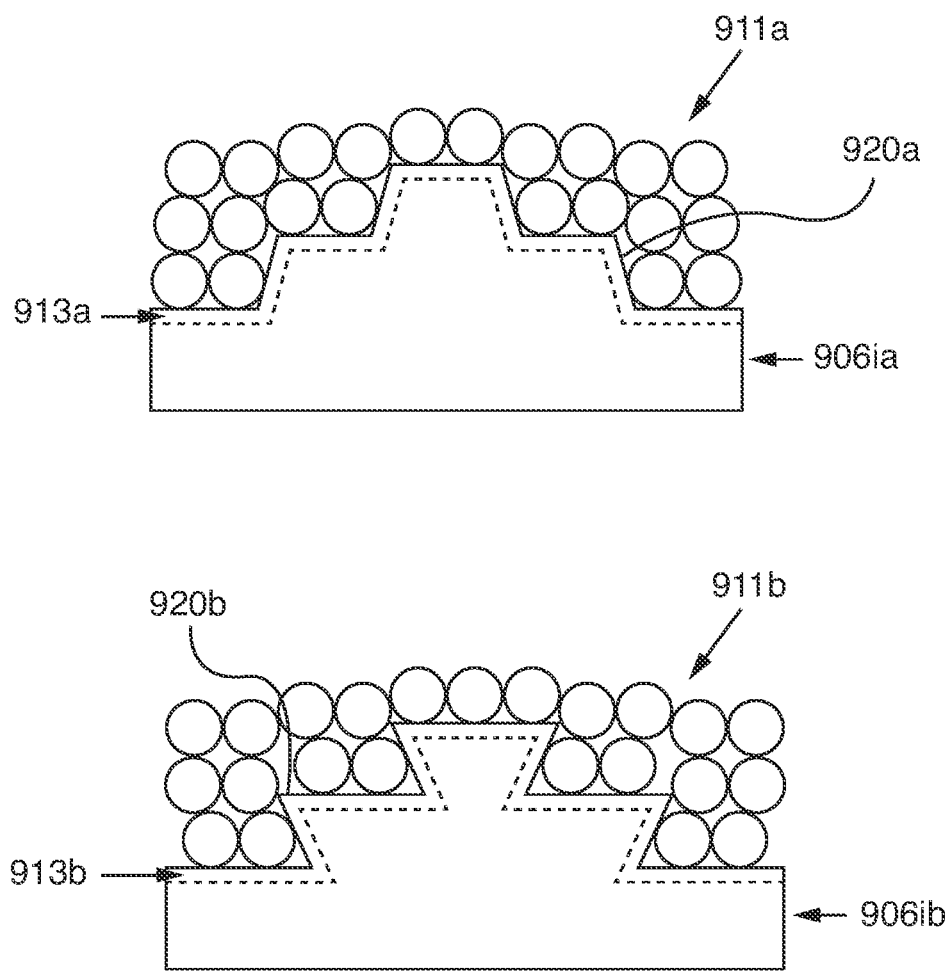
FIG. 9B is a cross-sectional view of a portion of a AM Interface Node having an engineered surface.

FIG. 9B is a cross-sectional view of Interface Nodes 911*a-b* having engineered surfaces. In accordance with this embodiment, the surfaces of the Interface Nodes 911*a-b* have been additively manufactured to include complex engineered surfaces 920*a-b*. These surfaces may be configured to significantly improve the weld joint between the Interface Nodes 911*a-b* and the DED layers 911*a-b* by operating to distribute the heat affected zones (HAZs) 913*a-b* more evenly for optimal mechanical and material performance of the integrated structure (e.g., the Interface Node 906*ia* and the component to which it is affixed via the DED process). By increasing the effective surface area at the interfaces as shown by the engineered surfaces 920*a-b*, the blend layers for the weld joint increase. Thus, the Interface Node may have an engineered surface in certain embodiments, in lieu of a flat surface. Two exemplary embodiments of these engineered surfaces 920*a-b* are demonstrated in FIG. 9B. These embodiments advantageously ensure that the HAZs 913*a-b* are spread optimally at the interface between the Interface Nodes 906*ia-ib* and their DED parts, instead of resulting in a significant volume of the base material becoming an HAZ.

Figure 9C:
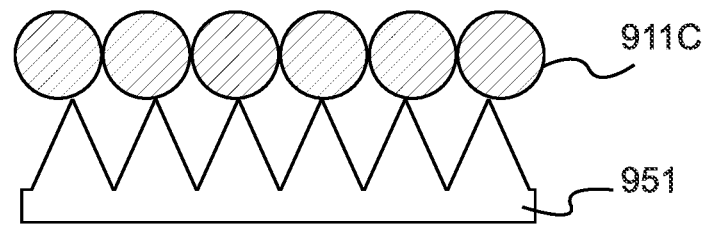
FIG. 9C is a cross-sectional view of a portion of an AM Interface Node having an alternative engineered surface.

FIG. 9C is a cross-sectional view of a portion of an AM Interface Node 951 having an alternative engineered surface. In this embodiment, in contrast to prior embodiments, the features of the engineered surface are smaller compared to the DED parts 911*c*. These smaller features are possible due to the high precision nature of the AM process being used to produce the Interface Node. Smaller features would further promote the adhesion, and hence the welding and bonding ability of the DED parts 911*c* onto the Interface Node surface.

Figure 9D:
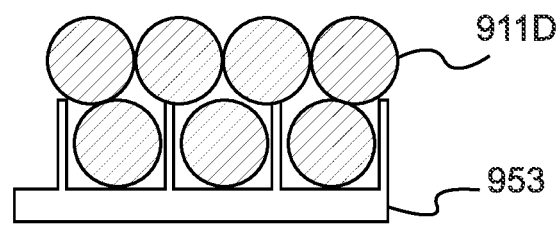
FIG. 9D is a cross-sectional view of a portion of an AM Interface Node having another alternative engineered surface.

FIG. 9D is a cross-sectional view of a portion of an AM Interface Node 911*d* having another alternative engineered surface composed of small fingers sticking upward. The protruding fingers may promote the adhesion of the two materials to each other.

Figure 9E:
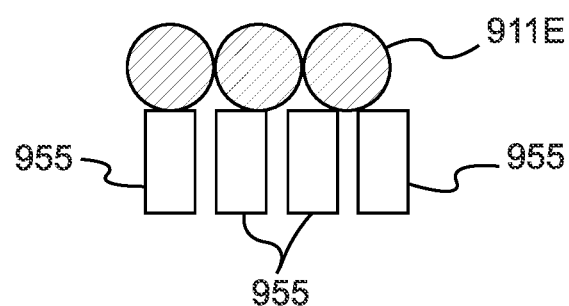
FIG. 9E is a cross-sectional view of a portion of an AM Interface Node having yet another alternative engineered surface.

FIG. 9E is a cross-sectional view of a portion of an AM Interface Node having yet another alternative engineered surface. The engineered surface includes initially a solid surface but has vertical portions cut out as another adhesion-promoting technique.

Interface Nodes fixtured: In still another embodiment, AM Interface Nodes may be fixtured to a five axis mount for greater flexibility. This configuration is particularly useful for DED techniques that render features that are substantially flat. In addition to their throughput benefits, many DED techniques are also precise and can yield intricate features. The wire feeder (or powder-based depositor, if powder is used) may fabricate complex DED structures over AM Interface Nodes. These complex DED structures may include parts with curvatures, parts with smaller high-resolution geometrical features, and other parts that may vary substantially in the numbers and types of shapes and/or sizes required.

Additional degrees of freedom for depositing material or providing further energy sources may be achieved by using processor-controlled robotic arms to support and provide the material depositor(s) and/or the energy source(s) for the DED processes. The robotic arms may be programmed and designed to move with six degrees of freedom, thereby adding flexibility to the build process 950. These additional degrees of freedom provided by the processor controlled robotic arms may be particularly beneficial for applications involving bridging between pairs of Interface Nodes. It should be noted that the overall build process may have even greater than six degrees of freedom where, for example, the Interface Nodes are fixtured to mechanisms having additional degrees of freedom.

In other embodiments, a hybrid process between AM and fabrication may include a number of different standard "Bridge Parts" made available to a robot such that during the wire deposition additive manufacturing of a part, a panel (curved or flat), a tube, a standardized Interface Node, boss, standoff, or other part or feature may be positioned by a robot so that it could be incorporated into the part being additively manufactured.

As an analogy for this procedure, the construction of a gingerbread house may be envisioned such that the walls are these "Bridge Parts", and the wire deposition is the frosting. This may be similar in certain ways to how hand fabricated parts are made, but automatically done with standard shapes that span certain areas to save time and cost of gas and consumables.

Figure 10:
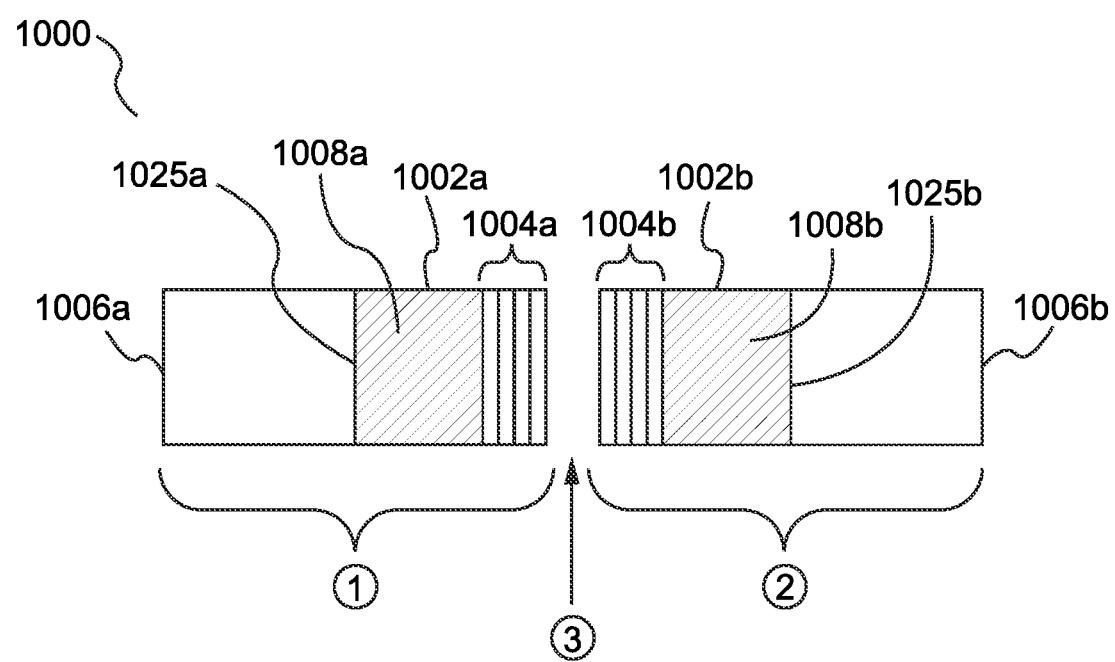
FIG. 10 is a front view of an intermediate stage of two Interface Nodes having DED structures grown therebetween for bridging the nodes.

FIG. 10 is a front view 1000 of an intermediate stage of two AM Interface Nodes 1006*a-b* having DED structures 1002*a-b* grown therebetween for bridging the nodes. In cases where a DED component may have to span a distance between two AM Interface Nodes 1006*a-b* as shown in FIG. 10, the DED deposition process may be performed sequentially or concurrently. As noted above, the DED process may commence over the features at issue—in this case the surfaces 1025*a* and 1025*b* of respective Interface Nodes 1006*a* and 1006*b*—to enable connection to Interface Nodes.

With initial reference to the sequential deposition process, the DED system may deposit layers 1004*a* to thereby grow the structure 1002*a* from the first Interface Node 1006*a* starting initially at the edge 1025*a* of Interface Node 1006*a*. (Region 1008*a* with the diagonal lines constitutes a portion of structure 1008*a* that was initially grown using DED, and the layers 1004*a*, which are part of that structure, are shown for clarity.) After the DED system completes growing structure 1002*a*, it may thereafter grow the structure 1002*b* from the second Interface Node in a similar manner.

To join the two sections indicated as 1 and 2 in the figure, the DED deposition process may next be performed between the two sections in region 3. Where an additional DED subsystem is available, the two DED subsystems may grow the structures 1002*a* and 1002*b* concurrently. Once sufficient material has been deposited in the "simultaneous" embodiment such that only a small section of material would be needed in region 3 to bridge the sections 1002*a* and 1002*b*, a single DED depositor may be configured to deposit the remaining material and thereby implement the fixture Interface Nodes. In other embodiments, the Interface Nodes 1006*a-b* may be fixtured to structures offering degrees of freedom such that the DED depositor is able to deposit material on a flat surface by virtue of controlling the orientation of the part (namely, the Interface Nodes 1006*a-b* themselves) in addition to the robotic arm.

Figure 11:
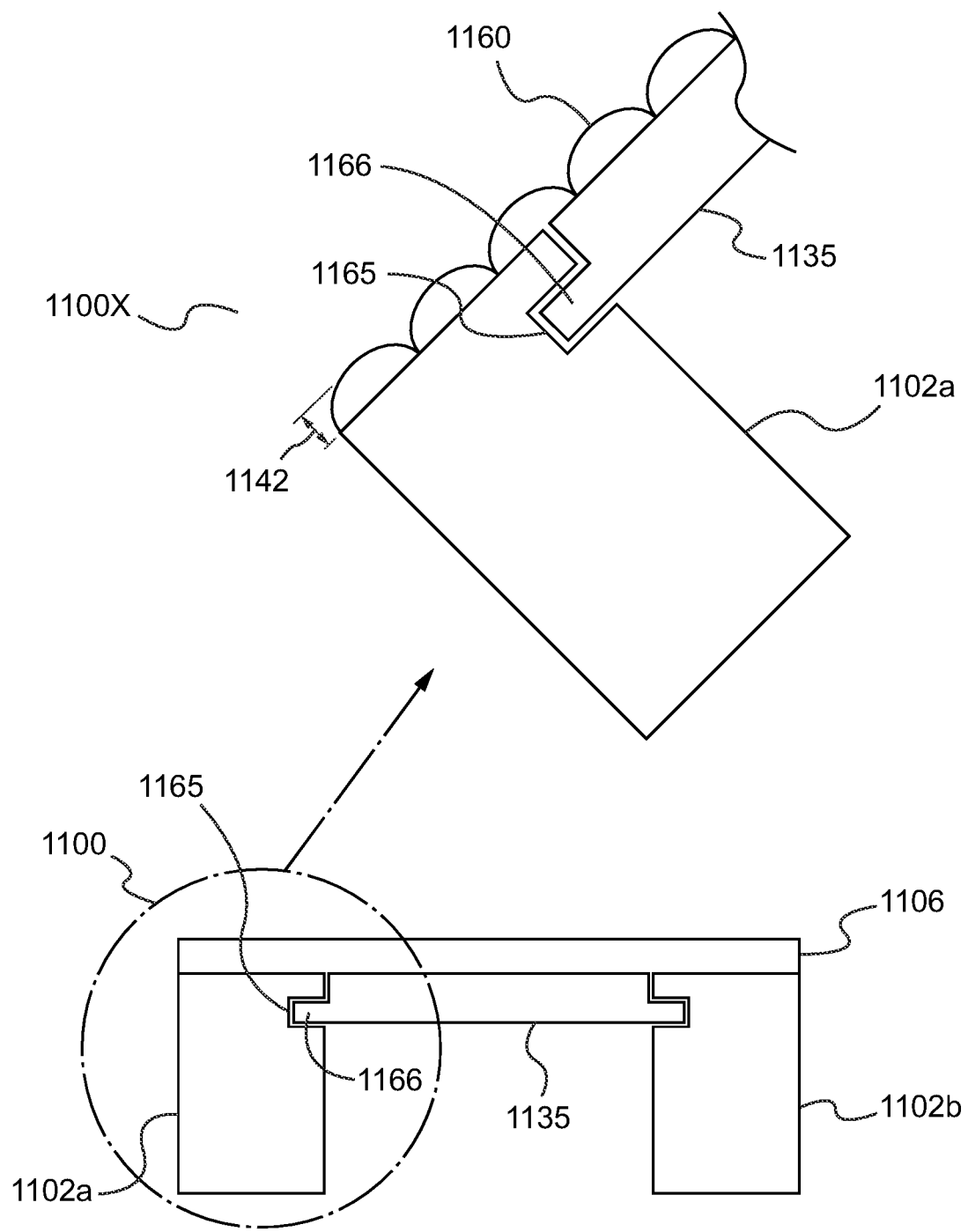
FIG. 11 is a front view of a pair of Interface Nodes and a removable base plate for depositing an overhanging DED structure.

In cases requiring overhanging structures, a removable base plate may be used. The Interface Nodes in this embodiment may be 3-D printed to include a mechanism to accept these base plates. FIG. 11 is a front view of a pair of Interface Nodes 1002*a-b* and a removable base plate 1135 for enabling deposition of an overhanging DED structure. AM Interface Nodes 1102*a-b* are shown having grooves 1165 for supporting a base plate 1135, which may be 3-D printed or co-printed with the nodes. In an embodiment, the base plate 1135 may include a water-cooled copper jacket. The base plate 1135 may be inserted into the Interface Nodes 1102*a-b* via the insertion of tongues 1166 into grooves 1165.

In an exemplary embodiment, the first, or first few, layers of material may be deposited using DED in conjunction with the base plate. The Interface Nodes 1102*a-b* may be fixtured to structures having additional degrees of freedom and, during the DED process, moved about to ensure that the energy emitted from the electron beam, laser, etc., is not directly transferred to the base plate 1135 but instead to each preceding weld/material bead 1160. The process begins at structure 1100*x* when a layer 1142 of material is deposited over the nodes 1102*a-b* and base plate 1135. This process may be repeated until a flat surface bridging the nodes 1102*a-b* is obtained. Following this process, the base plate 1135 can be removed and the deposition process may be resumed over the first DED layer(s). The first layer or first few layers may be machined to obtain a substantially flat surface such that the process may be performed on a flat surface.

The processes described in the figures above may be partially or entirely automated. For example, with respect to FIG. 11, automating the entire process would enable the build plate 1135 to be transferred such that multiple structures may be fabricated with little lead time.

Figure 12:
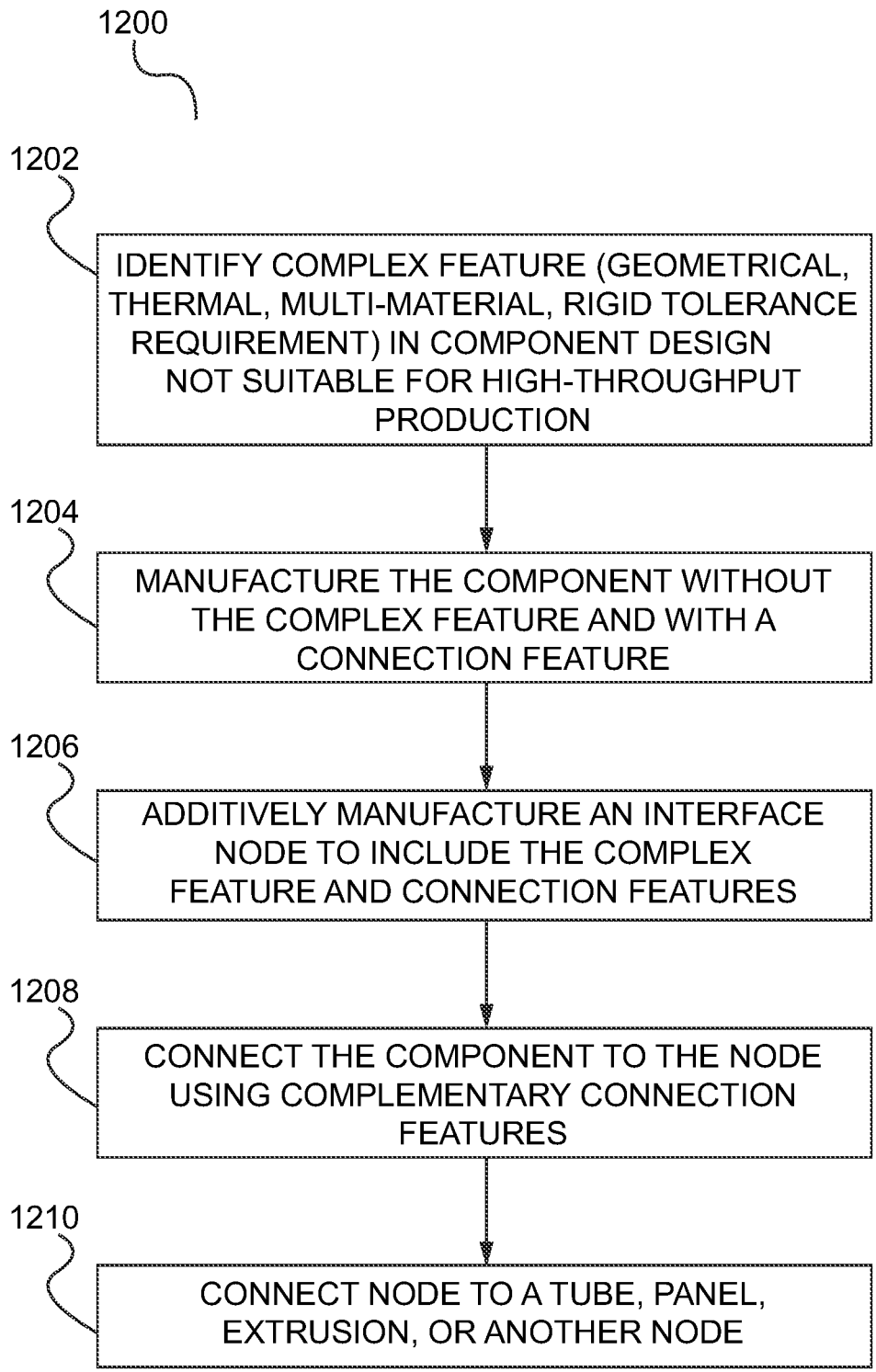
FIG. 12 illustrates a flow diagram of an exemplary method of manufacturing parts in accordance with the present disclosure.

FIG. 12 illustrates a flow diagram of an exemplary method of manufacturing parts in accordance with the present disclosure. Complex features are identified, e.g., in the product requirements, data model or other source of a component to be manufactured (1202). These complex features may include anticipated or known geometrical, thermal or multi-material requirements and rigid tolerance requirements. The component is thereupon manufactured without having the complex features, but including the relatively straightforward geometry of the component as well as one or more connection features enabling the component to connect to its associated Interface Node as well as potentially other structures (1204). In some embodiments, the component is constructed by using DED, separately or directly on a region of an Interface Node with which it is associated.

The Interface Node is also additively manufactured using PBF or another available AM process (1206) incorporating the complex features. The AM of the node may take place before, during or after the manufacturing of the component, except in cases where the component is configured to use the Interface Node as a build plate (in which case the node is necessarily 3-D printed prior to the production of the component).

The Interface Node can be connected to the component using complementary connection features—one feature on the component and a complementary feature on the Interface Node (1208). In the simplest cases, the connection features may be little more than an adhesive, and as such the connection features of the node and the component may be identical, with the complementary nature of the connection features inherent in the connection. Both the Interface Node and the component may be constructed using other connection features for connections to other structures. A connection between the Interface Node and the component and any other structure may use more than one connection feature.

The AM Interface Node may also be connected to a tube, panel, extrusion, another node, or another structure using one or more connection features in addition to the connection feature(s) used to engage with that of the component (1210). Thus, for example, the Interface Node may be configured to connect the component with a connecting tube, which may be connected to or part of a vehicle chassis. The component also may be connected to a panel or other structure by means of the Interface Node.

The previous description is provided to enable any person skilled in the art to practice the various aspects described herein. Various modifications to these exemplary embodiments presented throughout this disclosure will be readily apparent to those skilled in the art, and the concepts disclosed herein may be applied to other techniques for printing nodes and interconnects. Thus, the claims are not intended to be limited to the exemplary embodiments presented throughout the disclosure, but are to be accorded the full scope consistent with the language claims. All structural and functional equivalents to the elements of the exemplary embodiments described throughout this disclosure that are known or later come to be known to those of ordinary skill in the art are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f), or analogous law in applicable jurisdictions, unless the element is expressly recited using the phrase "means for" or, in the case of a method claim, the element is recited using the phrase "step for."

What is claimed is:

1. An apparatus, comprising:
    a component manufactured using a production process; and
    an Interface Node (IN) additively manufactured (AM), the IN manufactured using a production process different from the production process of the component, the IN having:
        at least one connection feature at an interface of the IN configured to connect to the component, the component being additively manufactured using a production process different from a print process of the IN; and
        at least one structure, different from the at least one connection feature and separated from the interface of the IN, having a reduced size when additively manufactured using the production process of the IN instead of the production process of the component.

2. The apparatus of claim 1, wherein the component comprises an AM Linking Node.

3. The apparatus of claim 1, wherein the at least one connection feature is further configured to connect to a Linking Node.

4. The apparatus of claim 1, wherein the reduced size when additively manufacturing using the production process of the IN instead of the production process of the component provides increased production capacity.

5. The apparatus of claim 1, further comprising at least one of a set of complex features including a structural feature, a thermal feature, a multi-material feature comprising more than one material or combination thereof, a material characteristic, or a tolerance requirement.

6. The apparatus of claim 1, wherein the component includes another connection feature configured for engaging the at least one connection feature of the IN.

7. The apparatus of claim 1, wherein the production process of the component comprises Directed Energy Deposition (DED).

8. The apparatus of claim 7, wherein the at least one connection feature comprises an engineered surface configured to maximize a surface area for improving a weld joint with a deposited material used for the DED.

9. The apparatus of claim 1, wherein the at least one connection feature is coupled to the component via a Linking Node.

10. The apparatus of claim 1, wherein the IN comprises a different material than the component.

11. An apparatus comprising:
a cast component; and
an Interface Node (IN) additively manufactured (AM), the IN having:
at least one connection feature configured to connect to the cast component; and
at least one feature from a set including a geometrically complex feature, a thermally complex feature, a multi-material complex feature comprising different materials or compositions thereof, or a complex tolerance requirement,
wherein the at least one feature is adapted to replace at least one complex feature associated with the cast component without substantially reducing throughput of the cast component.

12. The apparatus of claim 11, wherein the at least one connection feature is further configured to connect to a cast or forged Linking Node.

13. The apparatus of claim 11, wherein the at least one connection feature comprises a male connection feature for engaging with a female connection feature on the cast component.

14. The apparatus of claim 13, wherein the male connection feature comprises a tongue for a tongue-and-groove connection.

15. The apparatus of claim 11, wherein the at least one connection feature comprises a female connection feature for engaging with a male connection feature on the cast component.

16. The apparatus of claim 15, wherein the female connection feature comprises a groove for a tongue-and-groove connection.

17. The apparatus of claim 11, wherein the at least one connection feature further comprises a sealant groove.

18. The apparatus of claim 11, wherein the at least one connection feature comprises at least one fluid port configured for use as an adhesive injection port or a vacuum port.

19. An apparatus, comprising:
a cast component; and
an Interface Node (IN) additively manufactured (AM), the IN having:
at least one connection feature configured to connect to the cast component;
an adhesive inlet channel; and
an isolation feature coupled to the IN and arranged between an interface of the IN and the cast component.

20. The apparatus of claim 19, further comprising a vacuum channel.

21. The apparatus of claim 19, wherein the IN and the cast component comprise different metals.

22. The apparatus of claim 21, wherein the at least one connection feature is further configured to connect to an extrusion or a panel.

23. The apparatus of claim 19, wherein the at least one connection feature is further configured to connect to a connecting tube.

24. The apparatus of claim 23, wherein the at least one connection feature further comprises a sealant groove.

25. An apparatus comprising:
a machined component; and
an Interface Node (IN) additively manufactured (AM), the IN having:
at least one connection feature configured to connect to the machined component, the machined component produced using a production process with lower geometric flexibility than a print process of the IN; and
at least one feature from a set including a geometrically complex feature, a thermally complex feature, a multi-material complex feature comprising different materials or compositions thereof, or a complex tolerance requirement,
wherein the at least one feature is adapted to replace at least one complex feature associated with the machined component without substantially reducing throughput of the machined component.

26. The apparatus of claim 25, wherein the at least one connection feature is further configured to connect to a forged component.

27. The apparatus of claim 25, wherein the at least one connection feature is further configured to connect to a Linking Node.

28. The apparatus of claim 25, wherein the at least one connection feature comprises a male connection feature for engaging with a female connection feature on the machined component.

29. The apparatus of claim 25, wherein the at least one connection feature comprises a female connection feature for engaging with a male connection feature on the machined component.

30. The apparatus of claim 29, wherein the female connection feature comprises a groove for a tongue-and-groove connection.

31. The apparatus of claim 30, wherein the male connection feature comprises a tongue for a tongue-and-groove connection.

32. The apparatus of claim 25, wherein the at least one connection feature comprises at least one fluid port configured for use as an adhesive inlet port or a vacuum port.

33. An apparatus comprising:
a machined component; and
an Interface Node (IN) additively manufactured (AM), the IN having:
at least one connection feature configured to connect to the machined component, the machined component produced using a production process with lower geometric flexibility than a print process of the IN;
an adhesive inlet channel; and
an isolation feature coupled to the IN and arranged between an interface of the IN and the machined component.

34. The apparatus of claim 33, further comprising an isolation feature between the IN and the machined component.

35. The apparatus of claim 34, wherein the IN and the machined component comprise different metals.

36. The apparatus of claim 33, wherein the machined component comprises at least one connection feature configured to enable the machined component to connect to another part.

37. The apparatus of claim 36, wherein the another part comprises any one or more of a connecting tube, an extrusion, another node, or another machined component.

* * * * *